United States Patent
Schubert et al.

(10) Patent No.: US 9,310,694 B2
(45) Date of Patent: Apr. 12, 2016

(54) ILLUMINATION SYSTEM FOR ILLUMINATING A MASK IN A MICROLITHOGRAPHIC EXPOSURE APPARATUS

(71) Applicant: Carl Zeiss SMT GmbH, Oberkochen (DE)

(72) Inventors: Erich Schubert, Ellwangen (DE); Alexander Kohl, Aalen (DE); Gerhard-Wilhelm Ziegler, Aalen (DE); Michael Patra, Oberkochen (DE); Markus Deguenther, Aalen (DE); Michael Layh, Altusried (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 196 days.

(21) Appl. No.: 13/901,306

(22) Filed: May 23, 2013

(65) Prior Publication Data
US 2013/0250264 A1 Sep. 26, 2013

Related U.S. Application Data

(63) Continuation of application No. 12/795,014, filed on Jun. 7, 2010, now Pat. No. 8,467,031, which is a continuation of application No. PCT/EP2008/010622, filed on Dec. 13, 2008.

(60) Provisional application No. 61/016,019, filed on Dec. 21, 2007.

(51) Int. Cl.
| G03B 27/42 | (2006.01) |
| G03B 27/54 | (2006.01) |
| G03F 7/20  | (2006.01) |

(52) U.S. Cl.
CPC ........ *G03F 7/70191* (2013.01); *G03F 7/70116* (2013.01); *G03F 7/70433* (2013.01)

(58) Field of Classification Search
CPC .................. G03F 7/70116; G03F 7/70191
USPC .............. 355/53, 67–71; 359/566, 558
See application file for complete search history.

(56) References Cited

U.S. PATENT DOCUMENTS
| 5,229,872 A | 7/1993 | Mumola |
| 5,296,891 A | 3/1994 | Vogt et al. |

(Continued)

FOREIGN PATENT DOCUMENTS
| DE | 103 43 333 | 4/2005 |
| EP | 1 262 836 | 12/2002 |

(Continued)

OTHER PUBLICATIONS
The extended European Search Report for corresponding EP Appl No. 11006780.8, dated Oct. 25, 2011.

*Primary Examiner* — Hung Henry Nguyen
(74) *Attorney, Agent, or Firm* — Fisher & Richardson P.C.

(57) ABSTRACT

An illumination system of a micro-lithographic projection exposure apparatus is provided, which is configured to illuminate a mask positioned in a mask plane. The system includes a pupil shaping optical subsystem and illuminator optics that illuminate a beam deflecting component. For determining a property of the beam deflecting component, an intensity distribution in a system pupil surface of the illumination system is determined. Then the property of the beam deflecting component is determined such that the intensity distribution produced by the pupil shaping subsystem in the system pupil surface approximates the intensity distribution determined before. At least one of the following aberrations are taken into account in this determination: (i) an aberration produced by the illuminator optics; (ii) an aberration produced by the pupil shaping optical subsystem; (iii) an aberration produced by an optical element arranged between the system pupil surface and the mask plane.

27 Claims, 14 Drawing Sheets

(56) References Cited

U.S. PATENT DOCUMENTS

| | | | |
|---|---|---|---|
| 5,523,193 A | 6/1996 | Nelson | |
| 6,285,488 B1 | 9/2001 | Sandstrom | |
| 6,515,257 B1 | 2/2003 | Jain et al. | |
| 6,924,885 B2 | 8/2005 | Botma | |
| 6,958,806 B2 | 10/2005 | Mulder et al. | |
| 7,061,582 B2 | 6/2006 | Zinn et al. | |
| 7,292,393 B2 * | 11/2007 | Kvamme | 359/566 |
| 7,714,983 B2 | 5/2010 | Koehler et al. | |
| 8,467,031 B2 | 6/2013 | Schubert et al. | |
| 2001/0043318 A1 * | 11/2001 | Mori | 355/53 |
| 2006/0087634 A1 | 4/2006 | Brown et al. | |
| 2007/0195394 A1 | 8/2007 | Chen et al. | |
| 2008/0129975 A1 * | 6/2008 | Suda | 355/71 |
| 2009/0262324 A1 | 10/2009 | Patra et al. | |
| 2010/0060873 A1 * | 3/2010 | Deguenther et al. | 355/66 |
| 2010/0265482 A1 | 10/2010 | Schubert et al. | |

FOREIGN PATENT DOCUMENTS

| | | |
|---|---|---|
| WO | WO 03/087943 | 10/2003 |
| WO | WO 2005/026843 | 3/2005 |
| WO | WO 2005/096098 | 10/2005 |
| WO | WO 2008/061681 A2 | 5/2008 |

* cited by examiner

ILLUMINATION SYSTEM FOR ILLUMINATING A MASK IN A MICROLITHOGRAPHIC EXPOSURE APPARATUS

CROSS-REFERENCE TO RELATED APPLICATIONS

This application is a continuation of, and claims benefit under 35 USC 120 to, international application PCT/EP2008/010622, filed Dec. 13, 2008, now U.S. Pat. No. 8,467,031, which claims benefit of U.S. Provisional Application No. 61/016,019, filed Dec. 21, 2007. International application PCT/EP2008/010622 is hereby incorporated by reference in its entirety.

FIELD

The disclosure generally relates to an illumination system for illuminating a mask in a microlithographic exposure apparatus. The disclosure further relates to a method of determining deflection angles to be produced by a beam deflecting component of a pupil shaping optical subsystem of such a system. Such a beam deflecting component may be realized as a diffractive optical element or a micro-electromechanical system (MEMS), and in particular a digital micro-mirror device (DMD), for example.

BACKGROUND

Microlithography (also called photolithography or simply lithography) is a technology for the fabrication of integrated circuits, liquid crystal displays and other microstructured devices. More particularly, the process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective and a wafer alignment stage for aligning the wafer coated with the photoresist. The illumination system illuminates a field on the mask that may have the shape of an elongated rectangular slit, for example.

In current projection exposure apparatus a distinction can be made between two different types of apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or scanner, each target portion is irradiated by progressively scanning the mask pattern under the projection beam in a given reference direction while synchronously scanning the substrate table parallel or anti-parallel to this direction. The ratio of the velocity of the wafer and the velocity of the mask is equal to the magnification of the projection objective, which is usually smaller than 1, for example 1:4.

It is to be understood that the term "mask" (or reticle) is to be interpreted broadly as a patterning device. Commonly used masks contain transmissive or reflective patterns and may be of the binary, alternating phase-shift, attenuated phase-shift or various hybrid mask type, for example. However, there are also active masks, e.g. masks realized as a programmable mirror array. An example of such a device is a matrix-addressable surface having a viscoelastic control layer and a reflective surface. More information on such mirror arrays can be gleaned, for example, from U.S. Pat. No. 5,296,891, U.S. Pat. No. 5,523,193, U.S. Pat. No. 6,285,488 B1, U.S. Pat. No. 6,515,257 B1 and WO 2005/096098 A2. Also programmable LCD arrays may be used as active masks, as is described in U.S. Pat. No. 5,229,872. For the sake of simplicity, the rest of this text may specifically relate to apparatus including a mask and a mask stage; however, the general principles discussed in such apparatus should be seen in the broader context of the patterning device as hereabove set forth.

As the technology for manufacturing microstructured devices advances, there are ever increasing demands also on the illumination system. Ideally, the illumination system illuminates each point of the illuminated field on the mask with projection light having a well defined intensity and angular distribution. The term angular distribution describes how the total light energy of a light bundle, which converges towards a particular point in the mask plane, is distributed among the various directions along which the rays constituting the light bundle propagate.

The angular distribution of the projection light impinging on the mask is usually adapted to the kind of pattern to be projected onto the photoresist. For example, relatively large sized features may involve a different angular distribution than small sized features. The most commonly used angular distributions of projection light are referred to as conventional, annular, dipole and quadrupole illumination settings. These terms refer to the intensity distribution in a pupil surface of the illumination system. With an annular illumination setting, for example, only an annular region is illuminated in the pupil surface. Thus there is only a small range of angles present in the angular distribution of the projection light, and thus all light rays impinge obliquely with similar angles onto the mask.

Different approaches are known in the art to modify the angular distribution of the projection light in the mask plane so as to achieve the desired illumination setting. In the simplest case a stop (diaphragm) including one or more apertures is positioned in a pupil surface of the illumination system. Since locations in a pupil surface translate into angles in a Fourier related field plane such as the mask plane, the size, shape and location of the aperture(s) in the pupil surface determines the angular distributions in the mask plane. However, any change of the illumination setting involves a replacement of the stop. This makes it difficult to finally adjust the illumination setting, because this would involve a very large number of stops that have aperture(s) with slightly different sizes, shapes or locations.

Many common illumination systems therefore include adjustable elements that make it possible, at least to a certain extent, to continuously vary the illumination of the pupil surface. Conventionally, a zoom axicon system including a zoom objective and a pair of axicon elements are used for this purpose. An axicon element is a refractive lens that has a conical surface on one side and is usually plane on the opposite side. By providing a pair of such elements, one having a convex conical surface and the other a complementary concave conical surface, it is possible to radially shift light energy. The shift is a function of the distance between the axicon elements. The zoom objective makes it possible to alter the size of the illuminated area in the pupil surface.

However, generally, with such a zoom axicon system only conventional and annular illumination settings can be produced. For other illumination settings, for example dipole or quadrupole illumination settings, additional stops or optical raster elements are involved. An optical raster element produces, for each point on its surface, an angular distribution which corresponds in the far field to certain illuminated areas. Often such optical raster elements are realized as diffractive optical elements, and in particular as computer generated holograms (CGH). By positioning such an element in front of the pupil surface and placing a condenser lens in between, it is possible to produce almost any arbitrary intensity distribution in the pupil surface. An additional zoom-axicon system makes it possible to vary, at least to a limited extent, the illumination distribution produced by the optical raster element.

However, the zoom axicon system often provides only limited adjustability of the illumination setting. For example, it is not possible to dislocate only one of the four poles of a quadrupole illumination setting along an arbitrary direction. To this end another optical raster element has to be used that is specifically designed for this particular intensity distribution in the pupil surface. The design, production and shipping of such optical raster elements is a time consuming and costly process, and thus there is little flexibility to adapt the light intensity distribution in the pupil surface to the needs of the operator of the projection exposure apparatus.

For increasing the flexibility in producing different angular distribution in the mask plane, it has been proposed to use mirror arrays that illuminate the pupil surface.

In EP 1 262 836 A1 the mirror array is realized as a microelectromechanical system (MEMS) including more than 1000 microscopic mirrors. Each of the mirrors can be tilted in two different planes perpendicular to each other. Thus radiation incident on such a mirror device can be reflected into (substantially) any desired direction of a hemisphere. A condenser lens arranged between the mirror array and the pupil surface translates the reflection angles produced by the mirrors into locations in the pupil surface. This known illumination system makes it possible to illuminate the pupil surface with a plurality of circular spots, wherein each spot is associated with one particular microscopic mirror and is freely movable across the pupil surface by tilting this mirror.

Systems are known from other patent documents such as US 2006/0087634 A1, U.S. Pat. No. 7,061,582 B2 and WO 2005/026843 A2.

However, also with the use of pupil shaping optical raster elements, in particular diffractive optical elements and mirror arrays, it can still be difficult to obtain the desired intensity distribution in the system pupil plane. In the case of diffractive optical elements the far field intensity distribution produced by a specific element is usually not obtained in the system pupil plane, because zoom lenses and axicon elements vary the far field intensity distribution. It has been shown, for example, that axicon elements have not only the desired influence on the position of illuminated areas in the system pupil plane, but also on the energy distribution within theses areas.

In the case of mirror arrays it has been found that the adjustment of the mirrors is very difficult if a specific angular distribution of the light impinging on mask is desired.

SUMMARY

The disclosure provides a method for determining deflection angles to be produced by a beam deflecting component of a pupil shaping optical subsystem, which is contained in an illumination system of a microlithographic projection exposure apparatus, wherein this method makes it possible to approximate the real intensity distribution in the system pupil surface as close as possible to a target intensity distribution.

In some embodiments, a method includes:
a) providing an illumination system of a microlithographic projection exposure apparatus, wherein the illumination system
   is configured to illuminate a mask positioned in a mask plane,
   includes the pupil shaping optical subsystem and
   includes illuminator optics that illuminate the beam deflecting component;
b) determining an intensity distribution in a system pupil surface of the illumination system;
c) determining the deflection angles such that the intensity distribution produced by the pupil shaping subsystem in the system pupil surface approximates the intensity distribution determined in step b), wherein at least one of the following aberrations are taken into account in this determination:
   i) an aberration produced by the illuminator optics;
   ii) an aberration produced by the pupil shaping optical subsystem;
   iii) an aberration produced by an optical element arranged between the system pupil surface and the mask plane.

The non-ideal behavior of optical elements described above may have systematic causes or may be the product of tolerances that vary from illumination system to illumination system. A systematic cause is assumed if it is identical with all illumination systems having the same design. Such systematic causes are therefore a result of design imperfections that cannot be completely avoided for cost reasons, for example. The machine depending causes for the non-ideal behavior are usually a result of material imperfections, manufacturing tolerances or varying ambient conditions.

The disclosure also provides a method of controlling a beam deflecting component, which is contained in an illumination system of a microlithographic projection exposure apparatus, wherein this method makes it possible to control the beam deflecting component such that it can accurately produce an intensity distribution in a system pupil surface of the illumination system which approximates as close as possible a target intensity distribution.

In certain embodiments, a method includes:
a) providing an illumination system of a microlithographic projection exposure apparatus, wherein the illumination system
   is configured to illuminate a mask positioned in a mask plane and
   includes the beam deflecting component, wherein the beam deflecting component produces an intensity distribution in a system pupil surface and includes a beam deflection array of reflective or transparent beam deflecting elements, wherein each deflecting element illuminates a spot in the system pupil surface having a position that can be varied by changing a deflection angle produced by the beam deflecting element;
b) determining a target intensity distribution in a system pupil surface of the illumination system;

c) determining an arrangement of spots in the system pupil surface that approximates the target intensity distribution determined in step b);
d) determining a function assigned to a beam deflecting element, wherein the function describes a relationship between positions of the spot illuminated by the beam deflecting element in the system pupil surface on the one hand and the deflection angle produced by the beam deflecting element when illuminating the light spots on the other hand;
e) determining deflection angles that are involved to obtain the arrangement of spots determined in step c) by using the function determined in step d);
f) supplying control signals to the beam deflecting elements such that the deflection angles determined in step e) are produced.

The beam deflection elements may be configured as mirrors which can be tilted by two tilt axes forming an angle therebetween. In some embodiments, the beam deflection elements are electro-optical or acousto-optical elements.

The disclosure further provides an improved diffractive optical element which is configured to be inserted into a light beam path of an illumination system of a microlithographic projection exposure apparatus such that it produces a desired intensity distribution in a system pupil surface of the illumination system.

Some embodiments implement a Fourier transform of an angular distribution produced by the diffractive optical element differs from the desired intensity distribution.

The desired intensity distribution may be defined by pupil quantities inner σ, outer σ and pole width. Values of the pupil quantities for the desired intensity distribution then differ from corresponding values for the Fourier transform of the angular distribution produced by the diffractive optical element by more than 0.1 (or even 0.2) for at least one of the inner and outer σ and/or by at least 1° (or even 2°) for the pole width.

In some embodiments, differences between the Fourier transform of an angular distribution produced by the diffractive optical element and the desired intensity distribution are determined such that an aberration, for example a deviation from the sine condition, produced by at least one optical element of the illumination system are at least partly compensated for.

The at least one optical element may be arranged in of one of the group consisting of:
illuminator optics which are configured to illuminate the diffractive optical element,
a pupil shaping optical subsystem which is arranged between the diffractive optical element and the system pupil surface.

BRIEF DESCRIPTION OF THE DRAWINGS

Various features and advantages of the present disclosure may be more readily understood with reference to the following detailed description taken in conjunction with the accompanying drawing in which.

DETAILED DESCRIPTION

I. General Structure of Projection Exposure Apparatus

Figure 1:
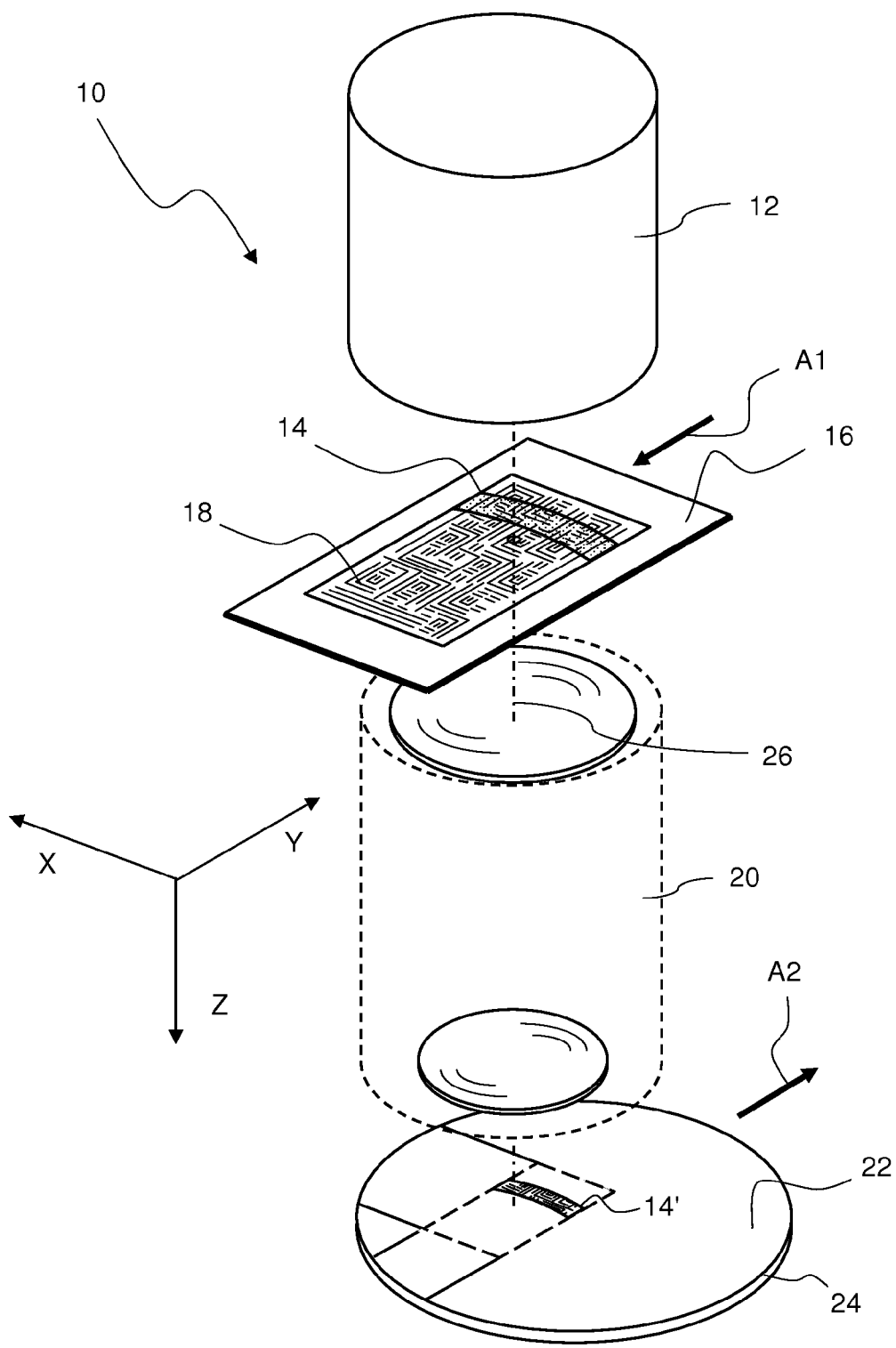
FIG. 1 is a perspective and considerably simplified view of a projection exposure apparatus in accordance with the present disclosure.

FIG. 1 is a perspective and highly simplified view of a projection exposure apparatus 10 that used in the manufacture of integrated circuits and other microstructured components. The projection exposure apparatus includes an illumination system 12 containing a light source that produces projection light and illumination optics that transforms the projection light into a projection light bundle having carefully defined properties. The projection light bundle illuminates a field 14 on a mask 16 containing minute structures 18. In this embodiment, the illuminated field 14 has approximately the shape of a ring segment. However, other, for example rectangular, shapes of the illuminated field 14 are contemplated as well.

A projection objective 20 images the structures 18 within the illuminated field 14 onto a light sensitive layer 22, for example a photoresist, which is applied on a substrate 24. The substrate 24, which may formed by a silicon wafer, is arranged on a wafer stage (not shown) such that a top surface of the light sensitive layer 22 is precisely located in the image plane of the projection objective 20. The mask 16 is positioned via a mask stage (not shown) in an object plane of the projection objective 20. Since the projection objective 20 has a magnification of less than 1, for example 1:4, a reduced image 14' of the structures 18 within the illuminated field 14 is formed on the light sensitive layer 22.

II. First Group of Embodiments

1. General Structure of Illumination System

Figure 2:
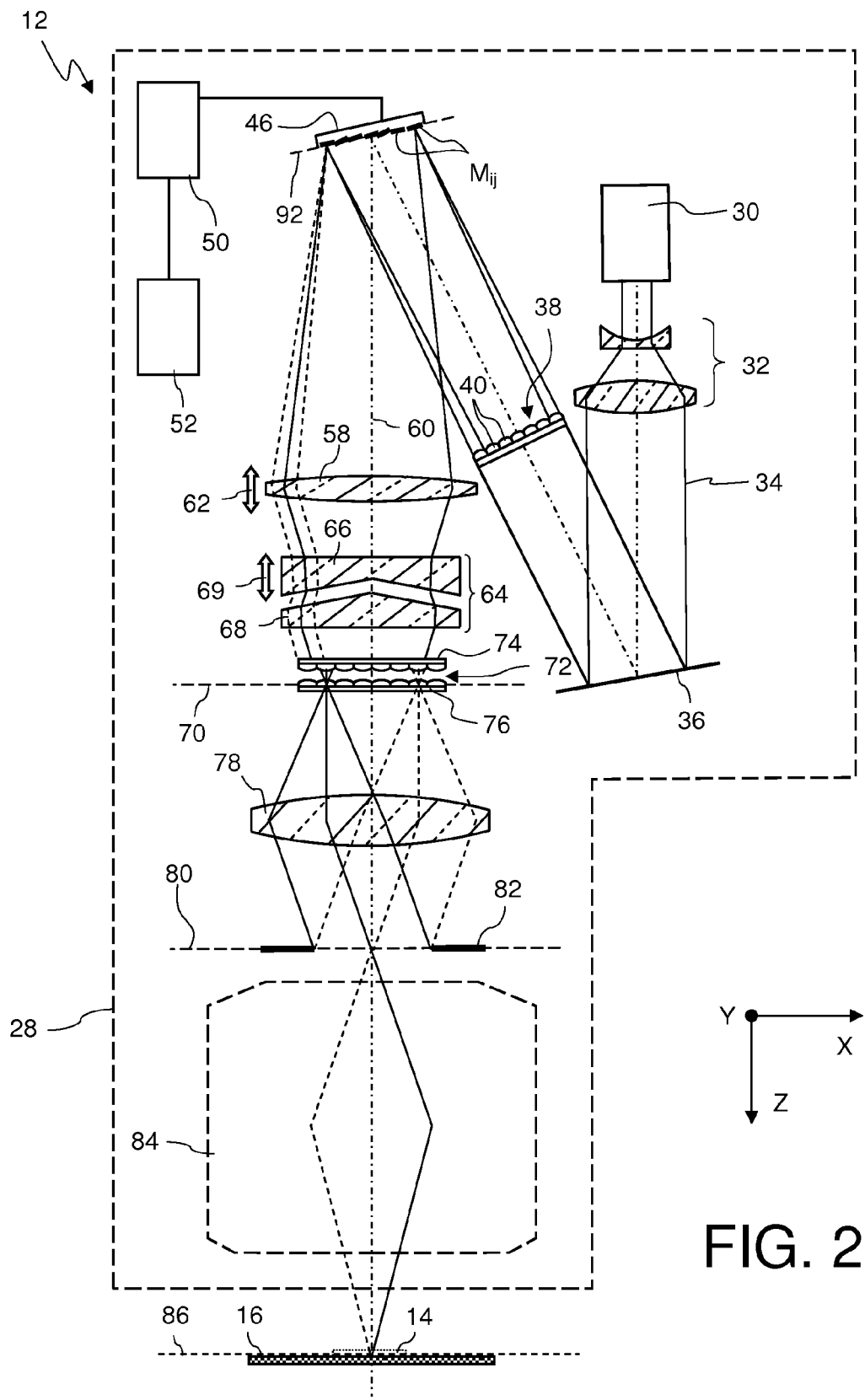
FIG. 2 is a meridional section through an illumination system contained in the projection exposure apparatus shown in FIG. 1.

FIG. 2 is a more detailed meridional section through a first embodiment of the illumination system 12 shown in FIG. 1. For the sake of clarity, the illustration of FIG. 2 is considerably simplified and not to scale. This particularly implies that different optical units are represented by very few optical elements only. In reality, these units may include significantly more lenses and other optical elements.

The illumination system 12 includes a housing 28 and a light source that is, in the embodiment shown, realized as an excimer laser 30. The excimer laser 30 emits projection light that has a wavelength of about 193 nm. Other types of light sources and other wavelengths, for example 248 nm or 157 nm, are also contemplated.

In the embodiment shown, the projection light emitted by the excimer laser 30 enters a beam expansion unit 32 in which the light bundle is expanded without altering the geometrical optical flux. The beam expansion unit 32 may include several lenses as shown in FIG. 2, or may be realized as a mirror arrangement. The projection light emerges from the beam expansion unit 32 as a substantially collimated beam 34. In other embodiments, this beam may have a significant divergence.

In this specific embodiment the collimated beam 34 impinges on a plane folding mirror 36 that makes it possible to reduce the overall dimensions of the illumination system 12.

After reflection from the folding mirror 36, the beam 34 impinges on an array 38 of micro-lenses 40. A mirror array 46 is arranged slightly in front of a back focal plane of the micro-lenses 40. As will be explained in more detail below, the mirror array 46 includes a plurality of small individual mirror elements $M_{ij}$ that can be tilted, independently from each other, by two tilt axes that may be aligned perpendicularly to each other. The total number of mirror elements $M_{ij}$ may exceed 100 or even several 1000. The reflecting surfaces of the mirror elements $M_{ij}$ may be plane, but could also be curved, if an additional reflective power is desired. Apart from that, the mirror surfaces could be provided with diffractive structures. The number of mirror elements $M_{ij}$ is equal to the number of micro-lenses 40 contained in the micro-lens array 38. Thus each micro-lens 40 is assigned exactly to the one mirror element $M_{ij}$ of the mirror array 46.

The tilting movements of the individual mirror elements $M_{ij}$ are controlled by a mirror control unit 50 which is connected to an overall system control 52 of the illumination system 12. Actuators that are used to set the desired tilt angles of the mirror elements $M_{ij}$ receive control signals from the mirror control unit 50 such that each individual mirror element $M_{ij}$ is capable of reflecting an impinging light ray by a reflection angle that is variable in response to the control signal. In the embodiment shown there is a continuous range of tilt angles, and therefore reflection angles, at which the individual mirror elements $M_{ij}$ can be arranged. In other embodiments, the actuators are configured such that only a limited number of discrete tilt angles can be set.

Figure 3:
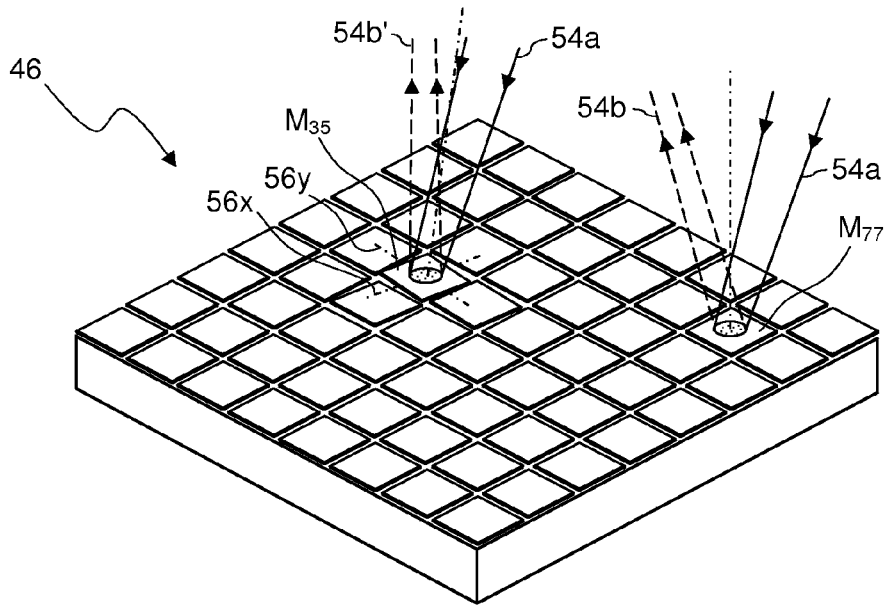
FIG. 3 is a perspective view of a mirror array contained in the illumination system of FIG. 2.

FIG. 3 shows a perspective view of the mirror array 46 including 8·8=64 mirror elements $M_{ij}$. Parallel light bundles 54a impinging on the mirror array 46 are reflected to different directions depending on the tilt angles of the mirror elements $M_{ij}$. In this schematic representation it is assumed that a particular mirror element $M_{35}$ is tilted about two tilt axes 56x, 56y relative to another mirror element $M_{77}$ so that the light bundles 54b, 54b' which are reflected by the mirror elements $M_{35}$ and $M_{77}$, respectively, are reflected into different directions.

Figure 4:
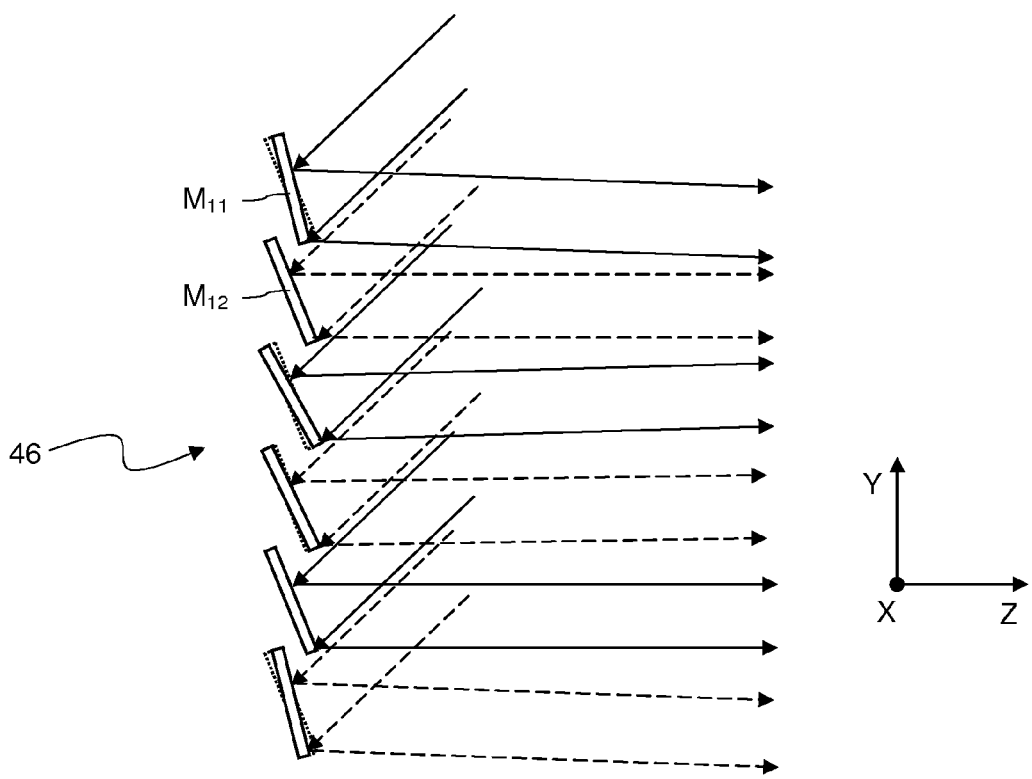
FIG. 4 is a cross-section through the mirror array of FIG. 3.

The cross section of FIG. 4 illustrates how, in a YZ plane, parallel light may be reflected into different directions by a plurality of adjacent mirror elements $M_{ij}$ that are tilted by various tilt angles in the YZ plane.

Referring again to FIG. 2, the illumination system 12 of this embodiment further includes a zoom lens system 58 having a variable focal length. The zoom lens system 58 is represented in FIG. 2 by a single lens which is displaceable along an optical axis of the illumination system 12, as is indicated by double arrow 62.

Behind the zoom lens system 58 a pair 64 of axicon elements 66, 68 having opposing conical surfaces is arranged. If both axicon elements 66, 68 are in immediate contact, the axicon pair 64 has only the effect of a plane parallel plate. If both axicon elements 66, 68 are moved apart, as is indicated in FIG. 2 by a double arrow 69, the spacing between the axicon elements 66, 68 causes a shift of light energy radially outward. Since axicon elements are known as such in the art, these will not be explained here in further detail.

Reference numeral 70 denotes a system pupil surface of the illumination system 12 that substantially defines the angular distribution of the light impinging on the mask 14. The system pupil surface 70 is usually plane or slightly curved and is arranged in or in immediate vicinity of an optical integrator 72 which produces a plurality of secondary light sources. The optical integrator 72 is realized, in the embodiment shown, as a fly's eye lens including two substrates 74, 76 that each includes two orthogonal arrays of parallel cylindrical microlenses. The optical integrator 72 increases the range of angles formed between the light rays and an optical axis OA of the illumination system 12. As the angular distribution in the system pupil surface 70 directly translates into an intensity distribution in a subsequent field plane, the optical integrator 72 substantially determines the geometry of the illuminated field 14 on the mask 16. Since the optical integrator 72 increases the range of angles considerably more in the X direction then in the Y direction, the illuminated field 14 has larger dimensions along the X direction than along the Y direction (i.e. the scan direction).

The projection light emerging from the secondary light sources produced by the optical integrator 72 enters a condenser 78 that is represented in FIG. 2 by a single lens only for the sake of simplicity. The condenser 62 ensures a Fourier relationship between the system pupil surface 70 and a subsequent intermediate field plane 80 in which a field stop 82 is arranged. The condenser 78 superimposes the light bundles, which are produced by the secondary light sources, in the intermediate field plane 80, thereby achieving a very homogenous illumination of the intermediate field plane 80. The field stop 82 may include a plurality of movable blades and ensures sharp edges of the illuminated field 14 on the mask 16.

A field stop objective 84 provides optical conjugation between the intermediate field plane 80 and the mask plane 86 in which the mask 16 is arranged. The field stop 82 is thus sharply imaged by the field stop objective 84 onto the mask 16.

The provision of the zoom lens system 58 and the axicon elements 66, 68 is particularly useful if the total number of mirror elements $M_{ij}$ is small. This is because the small number of mirror elements $M_{ij}$ provides only for a limited variability in illuminating the system pupil surface 70. Particularly if there are many 1000 of individual mirror elements $M_{ij}$, the zoom lens system 58 and the axicon elements 66, 68 may be completely dispensed with, or may be replaced by a condenser optical system which translates the angle distribution produces by the mirror elements $M_{ij}$ into an intensity distribution in the system pupil plane 70.

It should be well understood that various alternative embodiments are presently contemplated that are still within the scope of the present disclosure.

For example, the mirror array 46 may be replaced by any other deflective structure that makes it possible to direct light rays impinging on the structure into various directions, wherein the directions can be changed individually for different portions of the structure upon application of a suitable control signal. Such alternative structures may include, for example, electro-optical or acousto-optical elements. In such elements the refractive index may be varied by exposing a suitable material to ultrasonic waves or electric fields, respectively. These effects can be exploited to produce index gratings that direct impinging light into various directions.

As a matter of course, the zoom lens system 58 and/or the pair 64 of axicon elements 66, 68 may be completely dispensed with. The fly-eye lens 72 could be replaced by any other optical element, for example a diffractive optical element, which increases the geometrical optical flux. The use of a light mixing rod instead of a fly's eye lens is also contemplated. Furthermore, the mask 16 may be directly positioned in the field plane 80 if there is no need to have an illuminated field 14 having sharp edges at least along one direction. Also illumination systems in which first the field and then the pupil is shaped are presently contemplated.

2. General Function of Illumination System

In the following the general function of the illumination system 12 will be explained with reference to FIG. 4.

The collimated light beam 34 produced by the excimer laser 30 and the beam expansion unit 32 is subdivided by the micro-lenses 40 of the micro-lens array 38 into a plurality of individual light bundles that converge towards the mirror elements $M_{ij}$. Since the latter are arranged slightly in front of the back focal plane of the micro-lenses 40, the area illuminated on each mirror element $M_{ij}$ has not the geometry of point, but of a small circular disc, as it is shown in FIG. 3.

Behind the focal point the light bundles diverge again, as it is shown in FIG. 2. The zoom lens system 58 makes it possible to change the cone angle of each light bundle, and thus its diameter when it passes through the system pupil plane 70.

Figure 5:
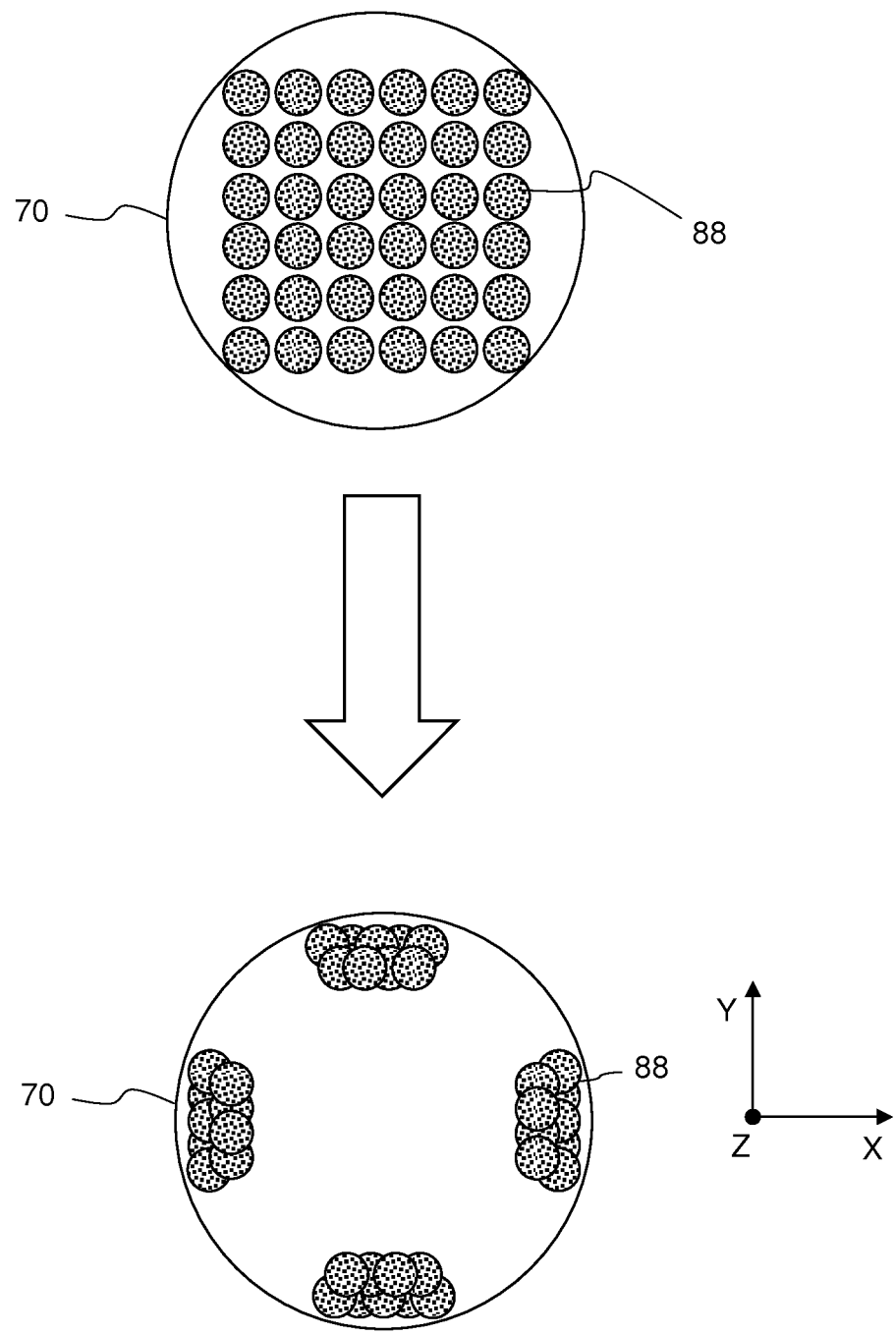
FIG. 5 illustrates how spots produced by individual beam deflecting elements may be arranged in the system pupil plane in order to approximate a desired intensity distribution.

Although no optical element may be arranged in the system pupil plane 70, the light filled areas produced by the mirror elements $M_{ij}$ in the system pupil plane will be referred to in the following as "spots". FIG. 5 illustrates in its top portion these spots 88 if all mirrors were arranged parallel to each other. In its bottom portion a different arrangement of the spots 88 which has been achieved by tilting the mirror elements $M_{ij}$ by suitable tilt angles. This tilting will be referred to in the following as "adjustment", because the mirror elements do not necessarily have to be tilted for changing variably deflecting the impinging light bundles. For example, the mirror surfaces could be curved, or a wedge shaped surface could be rotated.

In the arrangement shown in the bottom portion of FIG. 5 four poles each having a trapezoidal shape are symmetrically formed in the system pupil plane 70. The intensity distribution within each pole, and also the size and geometry of the poles, may be easily varied by simply re-adjusting some or all mirror elements $M_{ij}$. Consequently, the illumination system 12 makes it possible to produce almost any arbitrary intensity distribution in the system pupil plane 70, and thus to freely vary the angular distribution of light impinging on the mask 16.

Figure 6:
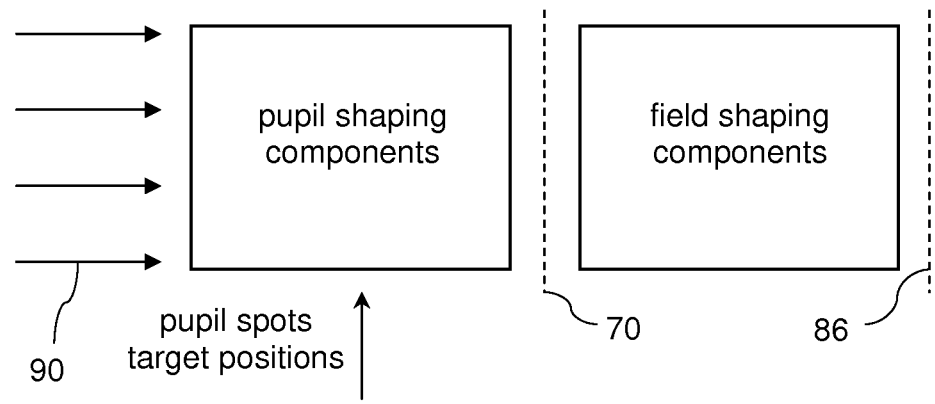
FIG. 6 is a schematic general layout scheme of the illumination system shown in FIG. 2.

FIG. 6 is a schematic illustration of the overall structure of the illumination system 12 shown in FIG. 2. The horizontal arrows 90 shown on the left hand side of FIG. 6 indicate projection light which impinges on the components that make it possible to produce a variable intensity distribution in the system pupil plane 70. These components include the micro-lens array 38, the mirror array 46, the zoom lens system 58 and the pair 64 of axicon elements 66, 68. These components mainly determine the intensity distribution in the system pupil plane 70 and are referred to in FIG. 6 with the term "pupil shaping components".

The shape of the field 14 illuminated on the mask 16 is mainly determined by the remaining optical components, namely the optical integrator 72, the condenser 78, the field stop 82 and the field stop objective 84. These components are arranged between the system pupil plane 70 and the mask plane 86 and are referred to in FIG. 6 with the term "field shaping components".

3. Control of Mirror Elements 3.1 General Control Scheme

In the following a general control scheme will be explained that may be applied when controlling the mirror elements $M_{ij}$. According to this scheme the determination of control signals for the mirror elements $M_{ij}$ is divided into a plurality of steps that are illustrated in the flow diagram of FIG. 7.

Step S1

In a first step S1 a target intensity distribution in the system pupil plane 70 is determined.

One may also start in a previous step (not shown in FIG. 7) from an angular light distribution in the mask plane 86 and determine the target intensity distribution in the system pupil plane 70 by simulations or measurements. Usually the angular light distribution in the mask plane 86 shall be identical for all field points. However, in some cases it may be advantageous to illuminate specific masks 16 with an angular light distribution which depends on the field position.

If the target intensity distribution in the system pupil plane 70 is derived from a target angular distribution in the mask plane 86 by measurements, it should be ensured that the intensity distribution is measured directly in the system pupil plane 70, and the angular distribution is directly measured in the mask plane 86. Since such a measurement is often difficult or even impossible, for example because there is no space left to insert any measurement equipment in the system pupil plane 70, a determination by simulation will often be the desired approach.

If the target intensity distribution in the system pupil plane 70 is derived from a target angular distribution in the mask plane 86 by simulation, aberrations introduced by optical elements arranged between the system pupil plane 70 and the mask plane 86 may be taken into account. In an ideal case the Fourier relationship between the system pupil plane 70 and the mask plane 86 is exactly fulfilled. This implies that the sine condition prevails for all points in the system pupil plane 70. Then positions in the system pupil plane 70 correctly translate into angles in the mask plane 86, and vice versa.

However, in real systems the Fourier relationship is not exactly fulfilled because the optical elements arranged between the system pupil plane 70 and the mask plane 86 are subject to optical aberrations. One result of such aberrations may be, for example, that the system pupil surface is not a plane, but a curved surface. If such aberrations exceed certain threshold values, they should be taken into account when control signals for the mirror elements $M_{ij}$ are determined if the target intensity distribution in the system pupil plane 70 is derived from a target angular distribution in the mask plane 86 by simulation.

Step S2

In a second step S2 an arrangement of spots in the system pupil surface is determined that approximates the target intensity distribution determined in step S1. This step S2 may involve the application of an algorithm which will be referred to in the following as "pupil algorithm". This algorithm will generally involve as input data the total number of available spots, the spot shapes (which may include the intensity distributions within each spot), and also (if applicable) any dependencies of these quantities on the spot position. The pupil algorithm then distributes the available spots over the usable system pupil plane 70 until the arrangement of the spots approximates as close as possible the target intensity distribution determined in step S1. To this end the pupil algorithm may employ probabilistic meta-algorithms such as the simulated annealing algorithm.

If the mirror control unit 50 detects a partial or full failure of a single mirror element $M_{ij}$, it may supply this information to the pupil algorithm. The pupil algorithm may then recalculate a suitable arrangement of spot positions which results in a intensity distribution in the system pupil plane 70 which approximates as accurately as possible the target intensity distribution determined in step S1.

In section 3.2 below the determination of the spot shape will be explained in more detail.

Step S3

In a next step S3 a function is assigned to each mirror element $M_{ij}$ which describes the relationship between positions of a spot illuminated by the mirror element $M_{ij}$ in the system pupil plane 70 on the one hand and the deflection angle produced by the mirror element $M_{ij}$ when producing the light spots on the other hand. The term "deflection angle" shall encompass in this context also physical quantities that are equivalent to the deflection angle, for example the orientation of a surface normal on the mirror element $M_{ij}$ or the tilt angles set by an appropriate control signal.

The determination of this function is subject of section 3.3 below.

Step S4

In a next step S4 deflection angles are determined that are involved to obtain the arrangement of spots, which has been determined in step S2, by using the function determined in step S3. After this determination it is clear which deflection angles have to be caused by the mirror elements $M_{ij}$ in order to produce the target intensity distribution in the system pupil plane 70 that has been determined in step S1.

Step S5

In a last step S5 control signals are supplied to the mirror elements $M_{ij}$ that ensure that the deflection angles determined in step S4 are produced. In the simplest case a feed-forward control scheme is applied, i.e. there is a fixed relationship between control signals on the one hand and deflection angles on the other hand. This relationship may be expressed as a look-up table or as a function, for example. If a certain deflection angle has to be set, the corresponding control signal is determined from the look-up table or the function and supplied to the individual mirror element $M_{ij}$ in question.

In the case of a closed-loop control, the deflection angle determined in step S4 is only supplied as a target value for the closed-loop control. An additional measurement device measures the actual deflection angle, for example by measuring the tilt angle of the mirror surfaces, and compares the actual values to the target values.

Figure 8:
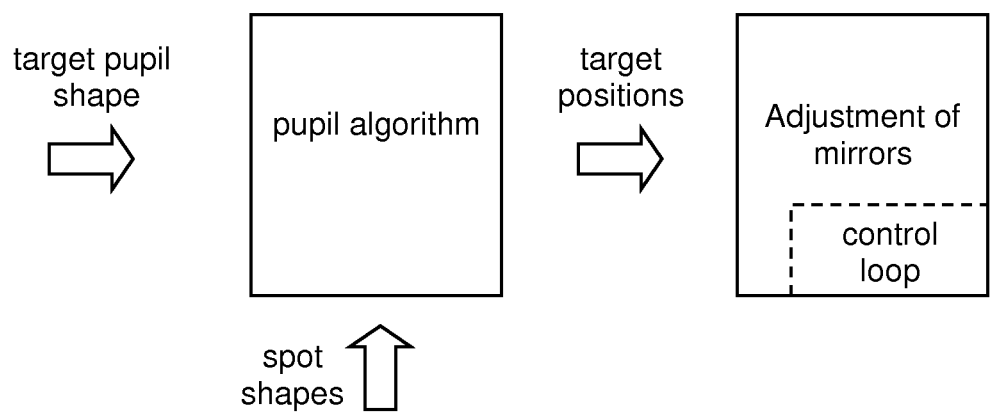
FIG. 8 is a schematic illustration of the main components that are involved to carry out the control scheme outlined in FIG. 7.
Figure 7:
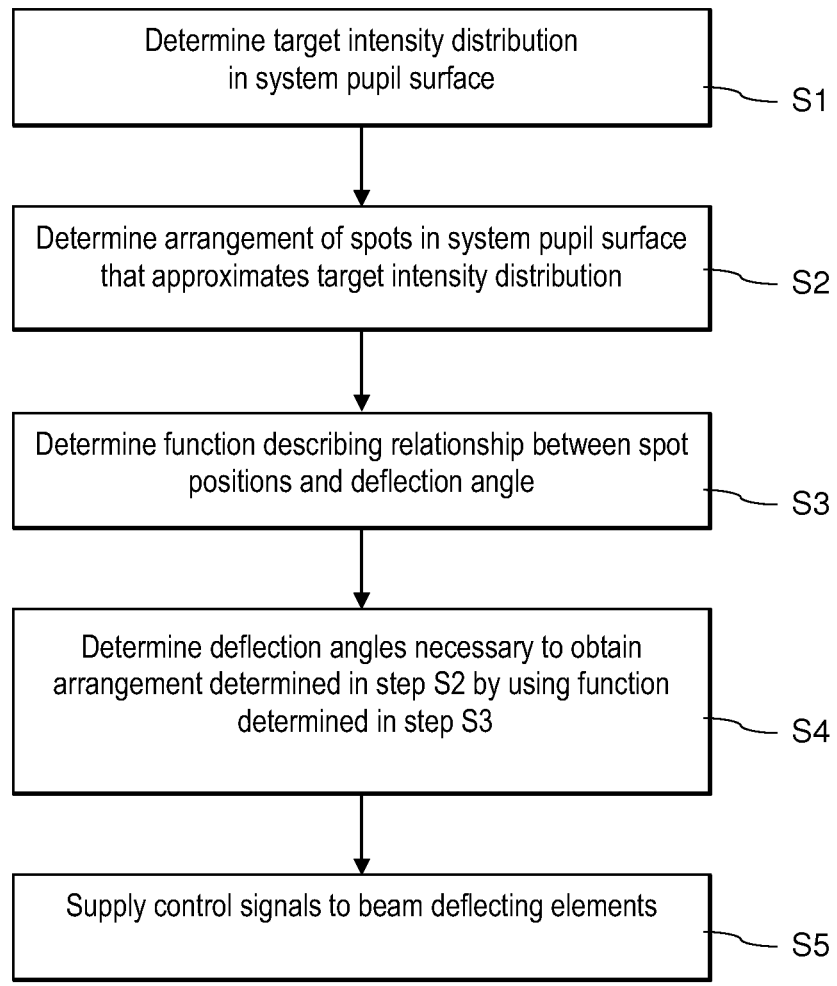
FIG. 7 is a flow diagram of a control scheme in accordance with the present disclosure.

FIG. 8 is a schematic illustration of the main components that are involved to carry out the control scheme outlined above with reference to FIG. 7. It should be noted that the determination of the target pupil shape and the computation of the spot arrangement (pupil algorithm) may be carried out on an external computer. The adjustment of the mirrors, which may involve the application of a closed-loop control, may be carried out within the projection exposure apparatus, for example in the overall system control 52 and the mirror control unit 52.

The determination of the spot shapes that are provided to the pupil algorithm is subject of the following section.

3.2 Spot Shape Determination

In the following it will be explained in more detail how the spot shapes may be determined that have to be provided to the pupil algorithm.

Ideally the spots produced by the mirror elements $M_{ij}$ in the system pupil plane 70 have identical sizes, geometries and intensity distributions for all mirror elements $M_{ij}$ and irrespective of the location where the spot is positioned in the system pupil plane 70. In real illuminations systems, however, at least some of these assumptions may not be (sufficiently) fulfilled. Such imperfections will have the result that the obtained intensity distribution in the system pupil plane 70 differs from the intensity distribution that would be needed to obtain the desired angular light distribution in the mask plane 86.

One cause for such a non-ideal behavior are aberrations associated with the pupil shaping components. Another cause are aberrations of optical elements that are involved to illuminate the mirror elements $M_{ij}$. The light 90 impinging on the mirror elements $M_{ij}$ then has non-ideal properties. For example, the total intensity and the angular distribution of the light bundles impinging on the individual mirror elements $M_{ij}$ may vary, because the collimated beam 34 has not a perfectly homogenous intensity and angular distribution, or because the micro-lenses 40 of the micro-lens array 38 have different focal lengths or scattering properties. If the mirror elements $M_{ij}$ are illuminated differently, the spots produced in the system pupil plane 70 by the mirror elements $M_{ij}$ will also differ, and thus the desired intensity distribution in the system pupil plane 70 cannot be easily be obtained.

Since it is usually not possible to completely eliminate the aberrations that result in the non-ideal behavior of the pupil shaping components, it is desirable to take the effects of these aberrations, i.e. the spot size variations, into account computationally.

Spot Shape Determination by Simulation

Figure 9:
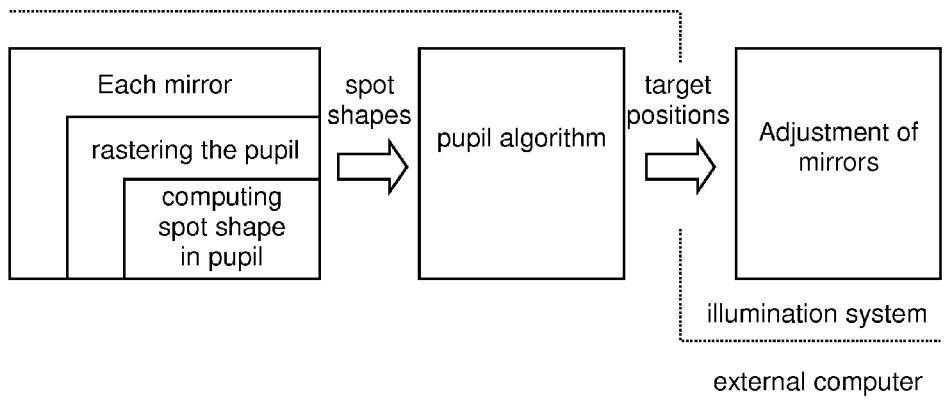
FIGS. 9 to 13 are schematic illustrations similar to FIG. 8, but for other embodiments of the control scheme.

If the spot shape variations have mainly systematic causes and do not substantially depend on tolerances and other caused associated with single illumination systems, such variations may be determined solely by simulation. As is shown in the schematic illustration of FIG. 9, such a simulation of the spot shapes will usually involve that the intensity distribution produced by a single mirror element $M_{ij}$ in the system pupil plane 70 is determined with the help of standard optics design programs, for example using ray tracing methods. This computation may be repeated for different angular orientations of each mirror element $M_{ij}$. The spot shapes determined in this way for each mirror element $M_{ij}$ are supplied to the pupil algorithm as input data. If the spot shape depends on the spot position, also the deflection desired to produce the spot at the various positions should be provided to the pupil algorithm.

With a dotted line those steps in this process that have to be carried out within the illumination system 12 are separated from the remaining steps that could, at least in principle, be carried out also in an external computer. The only data that have to be transmitted between this external computer and the illumination system 12 are the target positions determined by the pupil algorithm. The illumination system supplies these target positions to the mirror control unit 50 which controls the adjustment of the mirror elements $M_{ij}$ such that the angular target positions determined by the pupil algorithm are realized. With this approach which does not involve any measurements, the target positions computed by the pupil algorithm are independent from the specific illumination system so that they can be supplied to all illumination systems having the same design.

This approach may also be used for more complex tasks. For example, it may be desired that the angular distribution in the mask plane 86 depends on the field position. This can be accomplished by illuminating corresponding portions of the system pupil plane 70 from different directions, exploiting the fact that the optical integrator 72 is not ideal in the sense that the angular distribution produced by the optical integrator 72 is independent on the direction of the impinging light. By changing this direction it is therefore possible to "address" certain points in the mask plane 86. For example, if one pole in a system pupil plane 70 is illuminated substantially from one direction and an opposite pole is illuminated substantially from an opposite direction, different points in the mask plane 86 will be exposed to different asymmetrical angular distributions although both poles are illuminated with the same intensity.

Spot Shape Determination by Measurement

Instead of determining the spot shape by simulation, measurements may be carried out that also take into account aberrations that only occur with a specific illumination system, for example effects caused by manufacturing tolerances.

Such a measurement may be carried out by tilting all but one mirror elements $M_{ij}$ into an "off" position in which no light is reflected into the system pupil plane 70. With a pupil measuring sensor, which may be arranged in the mask plane 86 and measures the angular distribution of light impinging on a particular field point, it is possible to determine the spot shape produced by the mirror element which is in the "on" state. This involves a transformation of the measured angular distribution in the mask plane 86 into an intensity distribution in the system pupil plane 70. This transformation may take into account the optical effects produced by the optical elements arranged between the system pupil plane 70 and the mask plane 86.

This measurement is repeated for a plurality of different tilt angles of the mirrors. From the data obtained from this series of measurements a direct link can be established between the deflection, which is produced by the mirror element $M_{ij}$, and the spot shapes produced at the various positions.

Then the same measurements are repeated for another mirror element $M_{ij}$. In order to accelerate this process, the measurements may be carried out simultaneously for a number of mirror elements $M_{ij}$. This only involves that the mirror elements $M_{ij}$ illuminate clearly distinct regions in the system pupil plane 70 so that it is possible to unambiguously assign the data obtained in the pupil measuring sensor to the mirror elements that are presently in an "on" state.

Instead of measuring the spot shape with the help of a pupil measurement sensor arranged in the mask plane 86, the spot shape may be directly measured in the system pupil plane 70. To this end a position resolving sensor, for example a CCD sensor, may be inserted into the beam path at the axial position of the system pupil plane 70. After the measurements this sensor is removed from the beam path. However, this approach involves that there is sufficient space in or in the vicinity of the system pupil plane 70 to insert any measurement equipment.

Another option to carry out a measurement in the system pupil plane 70 is the provision of a beam splitter that separates a small portion of the light from the beam path and directs this portion to a position resolving sensor, for example a CCD sensor. This approach has the advantage that the beam splitter can be arranged at any position where there is sufficient space to accommodate the splitter. Additional optical elements arranged between the beam splitter and the sensor may be provided that have the same or at least a similar effect as those optical elements that are provided between the beam splitter and the system pupil plane 70. This ensures that the optical effects produced by the optical elements arranged between the beam splitter and the system pupil plane 70 are fully taken into account, and thus the intensity distribution on the sensor is at least substantially identical to the intensity distribution obtained in the system pupil plane 70. This approach to measure the intensity distribution in the system pupil plane 70 is described in German patent application DE 10 2006 054 746.2 which was filed Nov. 21, 2006 by the applicant.

Figure 10:
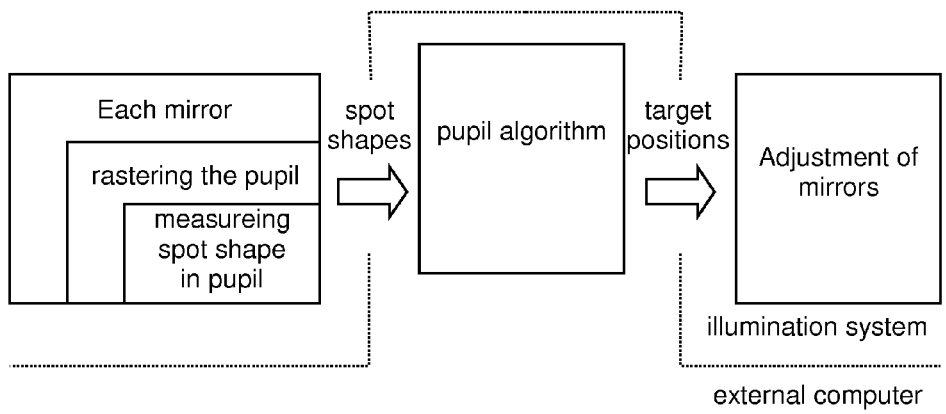

The measurement of the spot shape is schematically shown in FIG. 10. This figure differs from FIG. 9 only in that the spot shape is not computed, but measured, and in that the spot shape determination is carried out in the illumination system 12 and not in an external computer.

Spot Shape Determination by Simulation and Measurement

In certain cases a portion of the spot shape variations are systematic, and another portion depends on the specific illumination system. For example, the spot shape as such may only have a systematic variation, whereas other spot related parameters such as the total intensity in a spot may significantly differ from one illumination system to the other although the illumination systems are otherwise identical.

Figure 11:
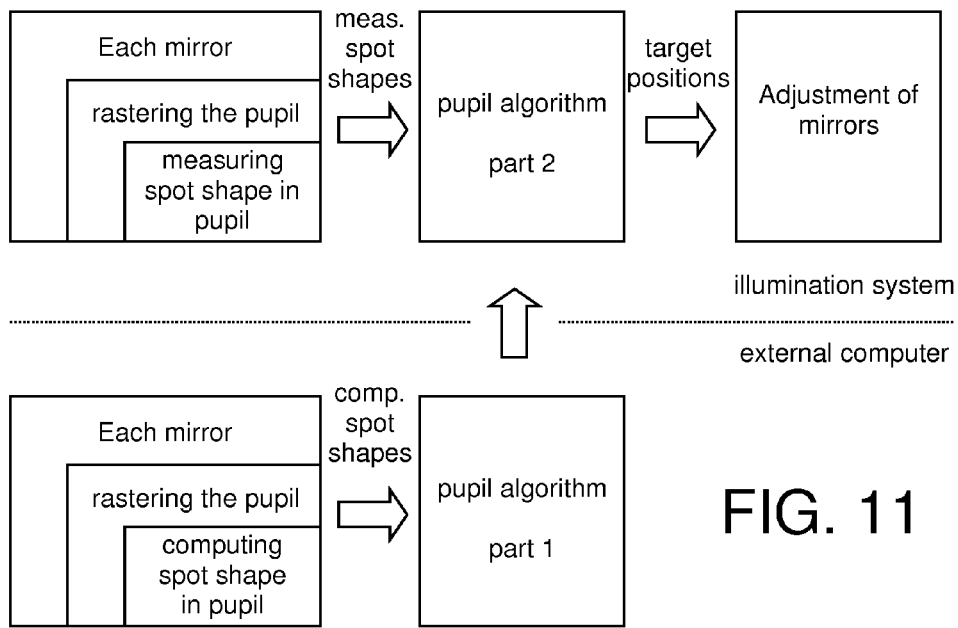

In this case the pupil algorithm may be separated into two different parts, as it is illustrated in FIG. 11. The first part, which involves the time consuming computation of spot shapes, can be carried out in an external computer and yields system independent results.

The second part takes into account the specific properties of the particular illumination system and adapts the target positions supplied by the first part.

Irrespective whether the spot shape is determined by simulation or by measurements, it is usually sufficient to describe the spot shape only by a small number of parameters and not by pixel information. This considerably reduces the amount of data that has to be supplied and considered by the pupil algorithm.

3.3 Mirror Adjustment

As has been explained above, the pupil algorithm only determines where the spots produced by the individual mirror elements $M_{ij}$ have to be positioned in the system pupil plane 70 (step S2). In the following it will be explained how the function mentioned in step S3 may be determined.

Simulation

Figure 12:
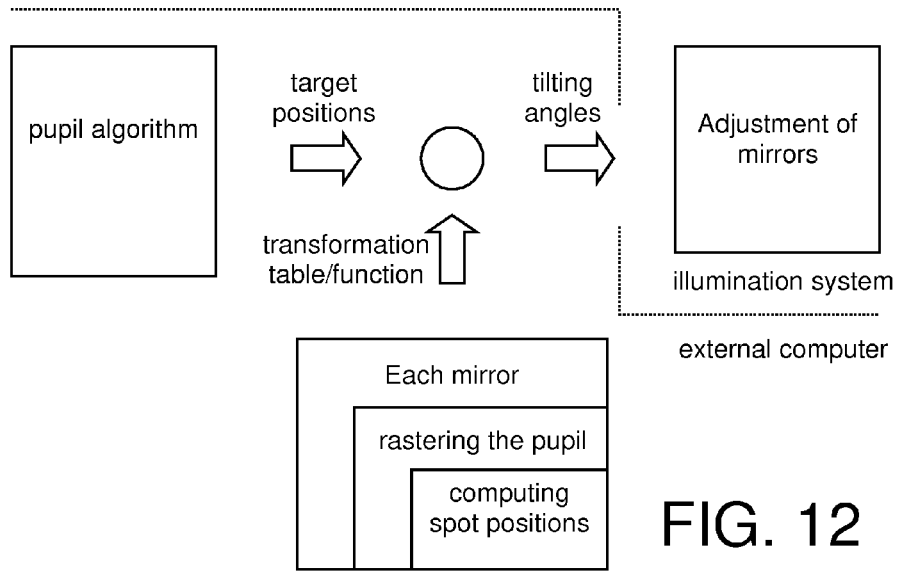

In a simulation, which is illustrated by FIG. 12, it can be determined for each mirror element $M_{ij}$ how the spot position in the system pupil plane 70 depends on the deflection produced by the mirror element $M_{ij}$, and thus on the tilt angle.

To this end the position of the spots has to be calculated for a number of different tilt angles of the respective mirror element $M_{ij}$. Since only the position, but not the shape of the spots has to be determined in this way, only a small number of light rays have to be traced for obtaining the dependency of the spot position on the tilt angles.

The data obtained in this way are then reversed so that the tilt angles are obtained as a discrete function of the spot positions. These data may be stored in a look-up table, or they may form the basis for a fit function that analytically describes the dependency of the tilt angles from the spot positions.

On the basis of the spot target positions calculated by the pupil algorithm it is then possible to determine, for each mirror, the tilt angles that are desired for the adjustment of the mirror elements $M_{ij}$. This calculation of the tilt angles may be completely carried out by an external computer so that only a small amount of data, namely the target tilt angles for each mirror element $M_{ij}$, have to be supplied to the mirror control unit 50 of the illumination system 12.

Measurement

Figure 13:
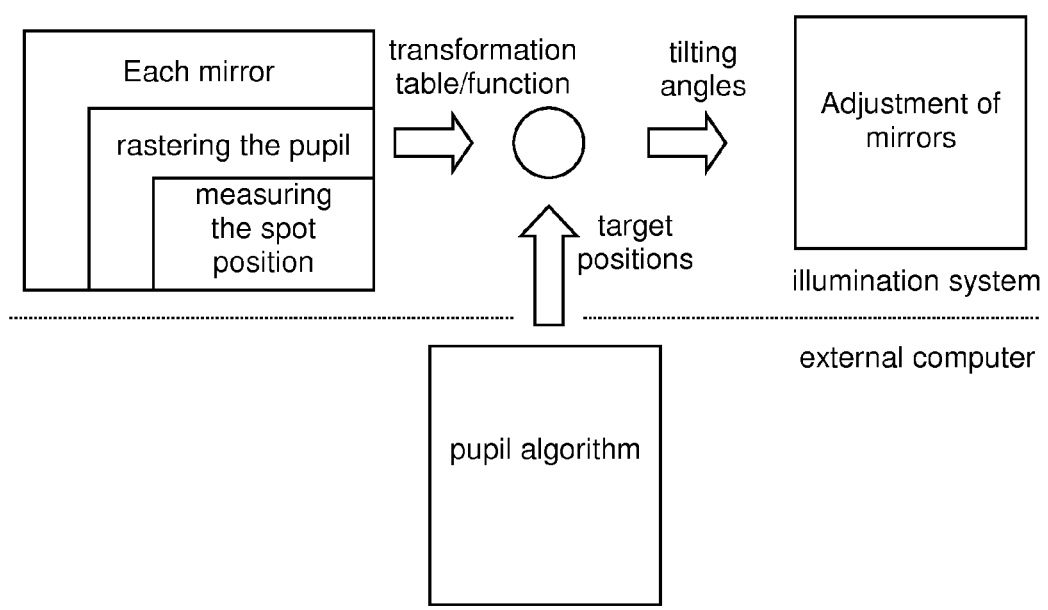

Alternatively, the relationship between the spot position and the tilt angles of the mirror elements $M_{ij}$ can be determined by measurements, as is illustrated in FIG. 13. To this end the spot position is measured for different tilt angles set for an individual mirror element $M_{ij}$. Similarly to the measurements of the spot shape, also the spot position can be determined by a pupil measuring sensor that measures the angular distribution of light in the mask plane 86. Also in the case of a measurement the relation tilt angles—spot position have to be inverted, and a fit function may be used instead of a look-up table that also provides tilt angles for interpolated spot positions.

Also in this context it may be envisaged to measure the spot position not indirectly by measuring an angular distribution in the mask plane 86, but directly in the system pupil plane 70 or using a sensor on which a small portion of the light is directed with the help of a beam splitter, as has been explained above in section 3.2 with reference to the measurement of the spot shape.

4. General Considerations

It should be noted that the same control scheme may also be applied in illumination systems in which not the pupil, but the field is shaped first. In such systems the mirror elements $M_{ij}$ are arranged in an array which has approximately the aspect ratio of the desired illuminated field on the mask 16. The mirror elements $M_{ij}$ then determine the intensity distribution in a pupil plane of an objective that images the mirror elements on the mask plane. Such systems also contain optical elements that illuminate the mirror elements, optical elements arranged between the mirror elements and the pupil plane, and also a group of optical elements that provides a Fourier relationship between the pupil plane and the mask plane.

II. Second Group of Embodiments

1. General Structure of Illumination System

Figure 15:
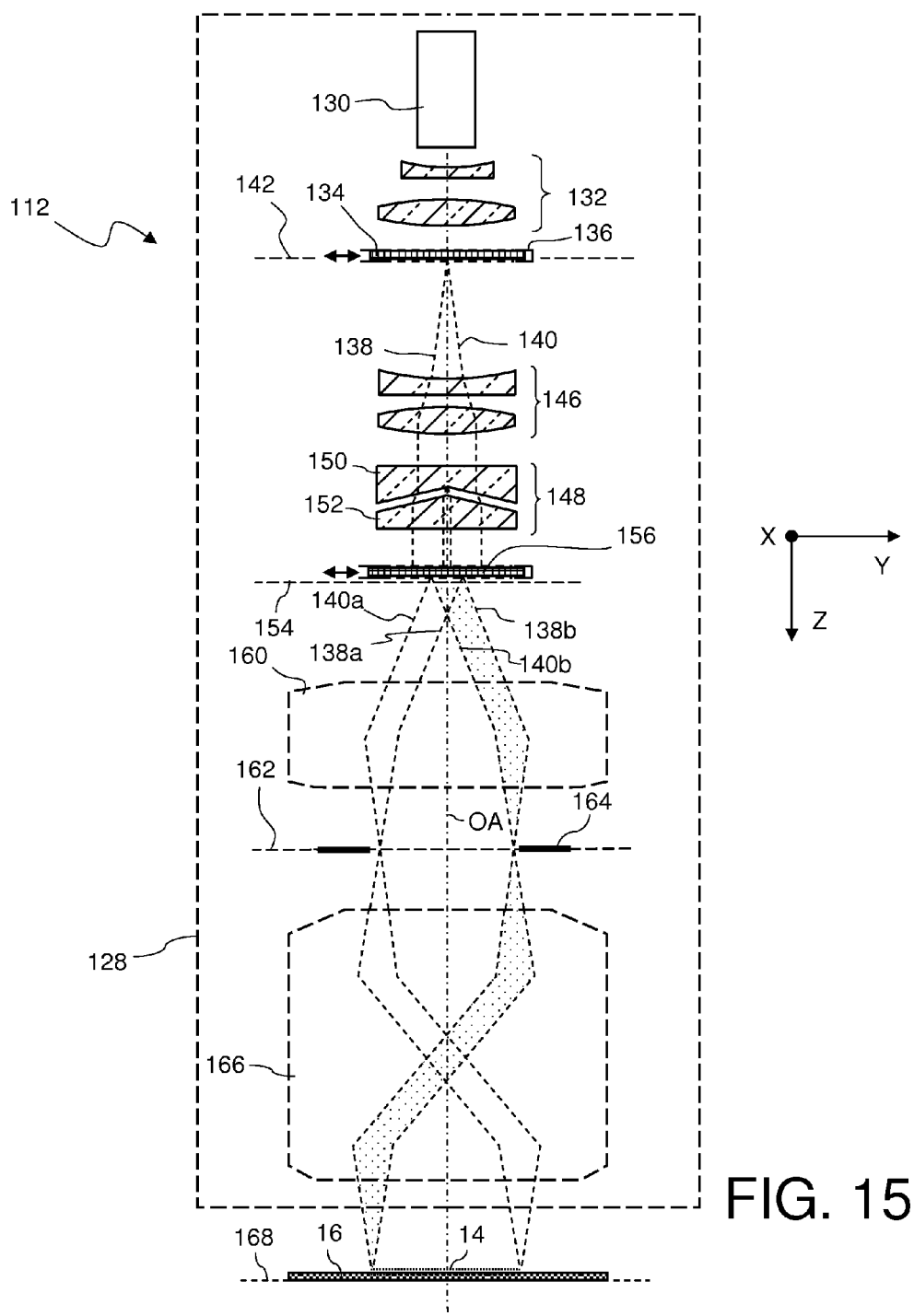
FIG. 15 is a meridional section through an illumination system according to another embodiment contained in the projection exposure apparatus shown in FIG. 1.

FIG. 15 is meridional section through an illumination system 112 according to a second embodiment which is suitable for the use in the projection exposure apparatus shown in FIG. 1. For the sake of clarity, the illustration of FIG. 15 is also considerably simplified and not to scale. This particularly implies that different optical units are represented by very few optical elements only. In reality, these units may include significantly more lenses and other optical elements.

The illumination system 112 includes a housing 28 and a light source that is, in the embodiment shown, realized as an excimer laser 130. The excimer laser 130 emits projection light that has a wavelength of about 193 nm. Other wavelengths, for example 248 nm or 157 nm, are also contemplated.

The projection light emitted by the excimer laser 130 enters a beam expansion unit 132 in which the light bundle is expanded. After passing through the beam expansion unit 132, the projection light impinges on a first optical raster element formed by a diffractive optical element (DOE) 134. The diffractive optical element 134 is received in a first exchange holder 136 so that it can easily be replaced by other diffractive optical element producing different angular distributions. The diffractive optical element 134 includes, in the embodiment shown, one or more diffraction gratings that deflect each incident ray such that a divergence is introduced. This means that at each location on the optical raster element 134, light is diffracted within a certain range of angles. This range may extend, for example, from −3° to +3°. In FIG. 2 this is schematically represented for an axial ray that is split into two diverging rays 138, 140. The diffractive optical element 134 thus modifies the angular distribution of the projection light and influences the far field intensity distribution.

The diffractive optical element 134 is positioned in a front focal plane 142 of a zoom lens group 146 which collimates the diverging light rays emerging from the diffractive optical element 134. By adjusting the zoom lens group 146 it is thus possible to vary the diameter of the projection light bundle. This at least substantially collimated light bundle then enters a pair 148 of axicon elements 150, 152 having opposing conical faces. If both axicon elements 150, 152 are in contact, the axicon pair 148 has the effect of a plate having parallel plane surfaces. If both elements 150, 152 are moved apart, the spacing between the axicon elements 150, 152 results in a shift of light energy radially outward. A light bundle having a cross section of a circular disk will thus be transformed into a light bundle having the cross section of a ring. Since axicon elements are known as such in the art, these will not be explained here in further detail.

Reference numeral 154 denotes a system pupil plane of the illumination system 112. Immediately in front of the system pupil plane 154 a second optical raster element 156 is arranged, which may include a plurality of micro-lens arrays. The second optical raster element 156 produces a plurality of secondary light sources in the system pupil plane 154. The secondary light sources may produce light with different divergences along the X and Y directions. For example, if the illuminated field 14 has the shape of a curved slit as is shown in FIG. 1, the exit side numerical aperture of the second optical raster element 156 may be in the range from 0.28 to 0.35 in the X-direction and in the range from 0.07 to 0.09 in the Y-direction. The divergence introduced by the second optical raster element 156 is schematically represented in FIG. 15 by divergent rays 138*a*, 138*b* and 140*a*, 140*b* emerging from two different secondary light sources.

The diverging rays 138*a*, 138*b* and 140*a*, 140*b* emerging from the second optical raster element 156 enter a condenser 160. The front focal plane of the condenser 160 coincides with the system pupil plane 154, and the back focal plane will be referred to in the following as object plane 162. Thus a diverging light bundle emerging from a particular secondary light source in the system pupil plane 154 leaves the condenser 160 as parallel light bundles and completely illuminates the object plane 162. On the other hand, all light rays emerging from the secondary light sources under the same angle will converge to a single point in the object plane 162 (see dotted area in FIG. 2).

In or in close proximity to the object plane 162 a field stop 164 is positioned. A field stop objective 166 optically conjugates the object plane 162 to an image plane in which the mask 16 is positioned during the exposure operation. This image plane will therefore be referred to in the following as mask plane 168. The field stop objective 166 thus images the field stop 164 arranged in the object plane 162 onto the mask 16 and ensures sharp edges of the illuminated field 14 at least for the short lateral sides extending along the Y-direction.

2. Layout of Diffractive Optical Element

The main difference between the illumination system 12 shown in FIG. 2 and the illumination system 112 shown in FIG. 15 is that the diffractive optical element 134 replaces the array 46 of tiltable mirror elements $M_{ij}$. In the following an approach for an improved layout scheme for the diffractive optical element 134 will be explained.

2.1 Conventional Approach

Conventionally an intensity distribution in the system pupil plane 154 is determined in a first step. Then a diffractive optical element 134 is designed that produces in this intensity distribution in a Fourier related plane. In a Fourier related plane the sine condition applies exactly. The sine condition involves that a ray emerging from a first plane under an angle α will intersect a Fourier related second plane with a ray height p wherein p is proportional to sin(α).

Sometimes the intensity distribution in the Fourier related plane is also referred to as far field intensity distribution although this a good approximation only for small angles for which tan(α)≈sin (α).

The determination of the angular light distribution to be produced by the diffractive optical element therefore involves the task of calculating the inverse Fourier transform of the desired intensity distribution in the system pupil plane 154.

If the angular light distribution to be produced is known, use is made of known algorithms that make it possible to determine diffracting structures on the element such that the desired angular light distribution is obtained. A type of diffractive optical elements that can be used in this respect is sometimes referred to as computer generated holograms (CGH).

As a matter of course, certain constraints of a more technological nature restrict the variety of intensity distributions that may be produced with a diffractive optical element. For example, the steepness of the slopes of the intensity distribution cannot exceed certain threshold values because this would involve ideal illumination conditions of the diffractive optical element 134, an ideal layout of the diffractive optical element as such and also an ideal point spread function of any optical elements arranged between the diffractive optical element 134 and the system pupil plane 154.

Figure 16:
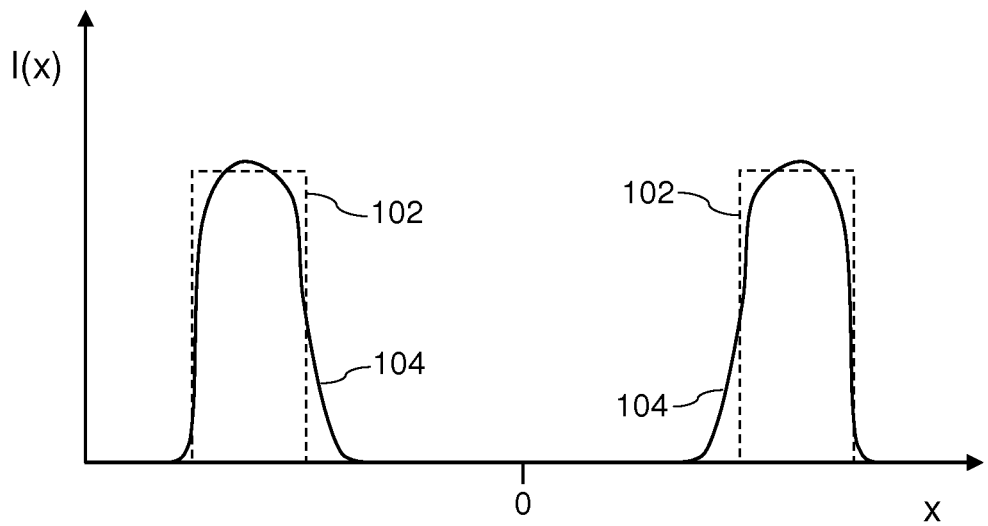
FIG. 16 is a graph that illustrates the far field intensity distribution produced by a diffractive optical element in accordance with the prior art.

In the graph of FIG. 16 broken lines 102 represent an exemplary desired intensity distribution in the system pupil plane 54. Here it is assumed that the intensity distribution consists of two poles that are arranged symmetrically with respect to the optical axis OA along the X direction. The desired intensity distribution 102 has infinitely steep slopes and a constant intensity within the illuminated area. Constant intensity distributions between slopes (infinite or not) are also referred to as top-hat distributions.

The solid lines 104 represent the intensity distribution in a Fourier related plane produced by a diffractive optical element 134 that has been conventionally designed so as to achieve the desired intensity distribution 102. As can be seen, the slopes of the real intensity distribution 104 are finite, but nevertheless the rectangular intensity distribution 102 is approximated to a very good degree.

However, in the conventional approach the effects produced by the zoom lens group 146 and the pair 148 of axicon elements 150, 152 are neglected to the extent that it is simply assumed that a Fourier relationship applies. However, the axicon elements 150, 152 strongly violate the sine condition if they are not in contact, and also the zoom lens group 146 usually introduces aberrations that result in violations of the sine condition.

Figure 17:
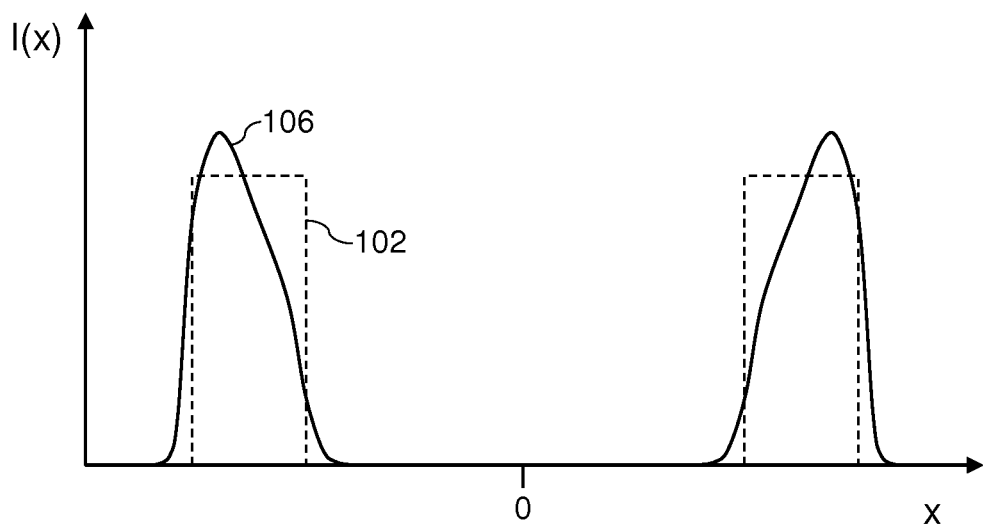
FIG. 17 is a graph that illustrates the actual intensity distribution in the system pupil plane produced by the diffractive optical element in accordance with the prior art.

In the graph of FIG. 17 the solid lines 106 represent the intensity distribution which is finally obtained in the system pupil plane 154 with the diffractive optical element 134 if the optical effects of the zoom lens group 146 and the pair 148 of axicon elements 150, 152 (in a given configuration) are taken into account. It can be clearly seen by comparing the graphs shown in FIGS. 17 and 16 that the optical elements considerably modify the intensity distribution.

The zoom lens group 146 and the axicon elements 150, 152 contribute differently to this modification. By adjusting the zoom lens group 146 it is possible to vary the diameter of the illuminated region in the system pupil plane 154. Ideally the intensity distribution remains uniform when the focal length of the zoom lens system 146 is changed. However, in real zoom lens systems 146 there may be significant deviations from this ideal behavior. For example, light may be concentrated more in the center of the illuminated area when the focal length is changed.

The axicon elements 150, 152, however, shift—if spaced apart—energy radially outward. It can be shown that the slopes of the inner flanks of the intensity distribution 106 are almost inversely proportional to the distance between the axicon elements 150, 152. With the maximum distance between the axicon elements 150, 152 these slopes reach their minimum steepness.

As a result of these effects, the approximation to the desired intensity distribution 102 deteriorates, and in particular the top-hat property is almost completely lost. Thus it may happen that the angular distribution in the mask plane 168 obtained with the diffractive optical element 134 may significantly differ from what has been expected on the basis of the far-field intensity distribution 104 produced by the diffractive optical element 134 alone, i.e. in the absence of the zoom lens group 146 and the axicon elements 150, 152.

It should be noted that deviations always occur if the optical elements arranged between the diffractive optical element 134 and the system pupil plane 154 do not exactly fulfill the sine condition. For example, in illumination systems that completely dispense with a condenser between the diffractive optical element 134 and the system pupil plane 154, only the far-field intensity distribution is obtained. As explained above, the far-field intensity distribution is only a good approximation to a Fourier related intensity distribution.

2.1 New Approach

According to the disclosure the optical effects produced by the zoom lens group 146 and the pair 148 of axicon elements 150, 152 (or any other optical element arranged between the diffractive optical element 134 and the system pupil plane 154) are taken into account when the optical element 134 is designed. Since the optical effects produced by the zoom lens group 146 and the axicon elements 150, 152 are known, the diffractive optical element can be designed such that it compensates for the modifications introduced by these elements. For example, if the axicon elements 150, 152 shift energy radially outward, the diffractive optical element 134 has to concentrate more energy in the centre of the system pupil plane 154.

Figure 18:
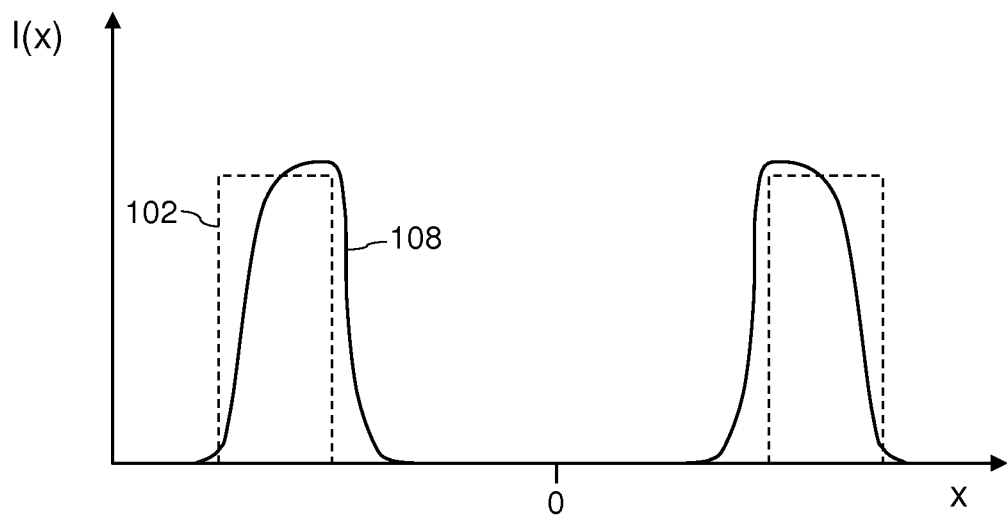
FIG. 18 is a graph that illustrates the far field intensity distribution produced by a diffractive optical element in accordance with the present disclosure.

The graph shown in FIG. 18 indicates with solid lines 108 an intensity distribution produced in a Fourier related plane by a diffractive optical element 134 that is designed in accordance with this new approach. By comparing this intensity distribution 108 with the intensity distribution 104 shown in FIG. 16, it becomes clear that more energy is directed by the diffractive optical element 134 into small angles (i.e. small absolute values of the x coordinate). The intensity distribution 108 produced by the diffractive optical element 134 thus considerably differs from the desired intensity distribution 102 indicated in broken lines.

However, in combination with the zoom lens group 146 and the pair 148 of axicon elements 150, 152, the intensity distribution produced in the system pupil plane 154 approximates very accurately the desired intensity distribution 102.

This is shown in the graph of FIG. 18 in which the actual intensity distribution produced by the diffractive optical element 134 in combination with the zoom lens group 146 and the pair 148 of axicon elements 150, 152 is indicated by solid lines 110.

It is to be understood that this approximation can only be achieved with a certain configuration of the zoom lens group 146 and the pair 148 of axicon elements 150, 152. If the focal length of the zoom lens group 146 and/or the distance between the axicon elements 150, 152 is varied, these components will produce a different optical effect, and the approximation may slightly deteriorate. Nevertheless a significant improvement as compared to the conventional approach illustrated in FIGS. 16 and 17 can be achieved also for other configurations of the zoom lens group 146 and the pair 148 of axicon elements 150, 152. Apart from that, many non-conventional illumination settings in which the intensity distribution in the system pupil plane 154 includes a plurality of separated areas involve the axicon elements are in contact so that they have only the effect of a plate having plane and parallel surfaces. Then (if any) only the smaller adverse effects of changes of the focal lengths in the zoom lens group 146 have to be taken into account.

It is even possible to take into account third or higher order optical aberrations produced in the zoom optical system 146 and the pair 148 of axicon elements 150, 152 when determining the angular light distribution to be produced by the diffractive optical element 134. Also these aberrations depend on the actual configuration of the zoom optical system 146 and the pair 148 of axicon elements 150, 152.

In still another embodiment not only optical properties and aberrations related to the optical elements arranged between the diffractive optical element 134 and the system pupil plane 154, but also (or exclusively) of optical elements arranged between the system pupil plane 154 and the mask plane 168 are taken into account when the angular light distribution to be produced by the diffractive optical element 134 is determined. For example, if the condenser 160 does not fulfill the sine condition for larger distances from the optical axis OA, the diffractive optical element 134 may be designed such that this effect is taken into account by either shifting energy to larger or to smaller diffraction angles. Then the system pupil plane 154 will be illuminated in such a way that the variations of the sine conditions are compensated for.

Figure 19:
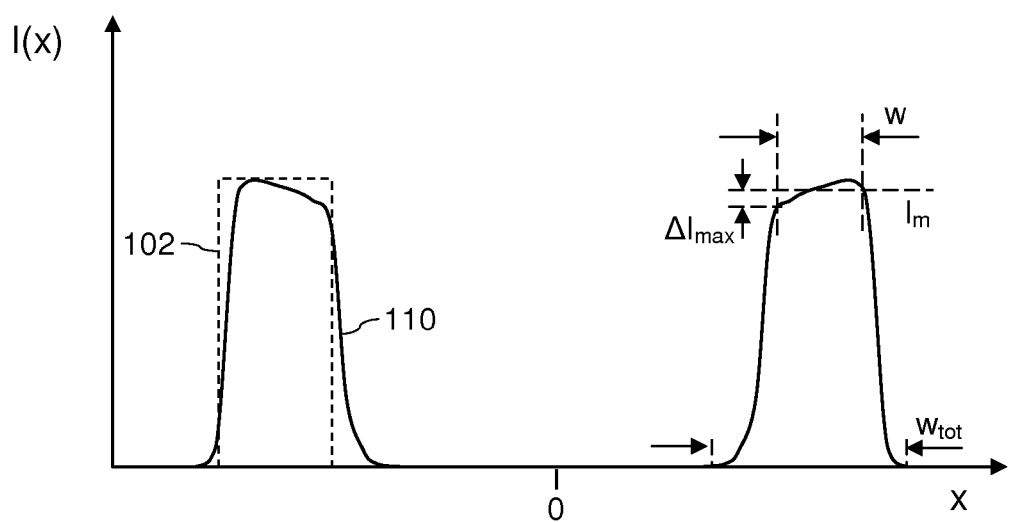
FIG. 19 is a graph that illustrates the actual intensity distribution in the system pupil plane produced by the diffractive optical element in accordance with the present disclosure.

As can be seen in FIG. 19, in a sub-region which has an area which is at least 80% of the total area of each pole, the maximum variations of the intensity relative to a mean intensity $I_m$ in this sub-region is less than 10%. In FIG. 19 the sub-region has along the x coordinate a width w, and the total area of the pole has the width $w_{tot}$. If $I_m$ is the mean intensity in this sub-region, the maximum variations $\Delta I_{max}$ from the mean intensity $I_m$ are below 20%, such as below 10%, in this sub-region.

Figure 20:
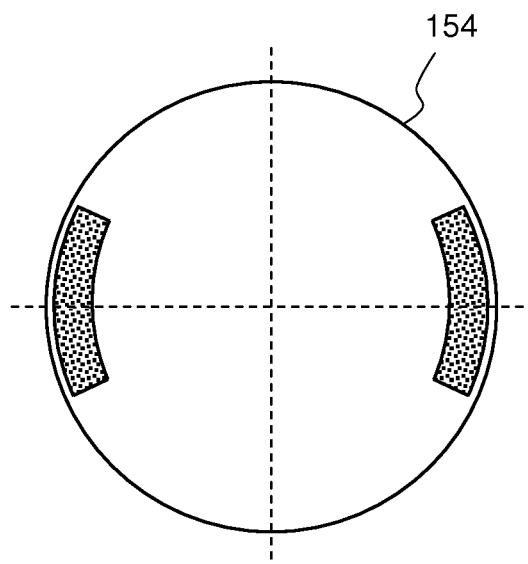
FIG. 20 illustrates an intensity distribution in the system pupil plane which corresponds to an X dipole setting.

FIG. 20 shows an actual intensity distribution in the system pupil surface 154 as produced by the diffractive optical element 134, illuminator optics and a pupil shaping optical subsystem. The illuminator optics includes the laser 130 and the beam expansion unit 132. The pupil shaping optical subsystem is formed by all components arranged between the diffractive optical element 134 and the system pupil surface 154.

The intensity distribution shown in FIG. 20 corresponds to an X dipole illumination setting. In this setting the polar width is 35°, the inner σ is 0.8, and the outer σ is 0.99. The inner σ is defined as the pupil radius in which 10% of the light intensity is in the pupil. The outer σ is defined as the pupil radius in which 90% of the illumination light intensity is in the pupil. The polar width is defined as the opening angle between radii which delimit an area illuminated in the pupil plane and at which the intensity has fallen to 50% of the maximum intensity of this area.

Figure 21:
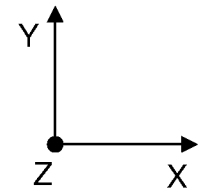
FIG. 21 illustrates an intensity distribution in the system pupil plane which corresponds to a Y dipole setting.
Figure 21:
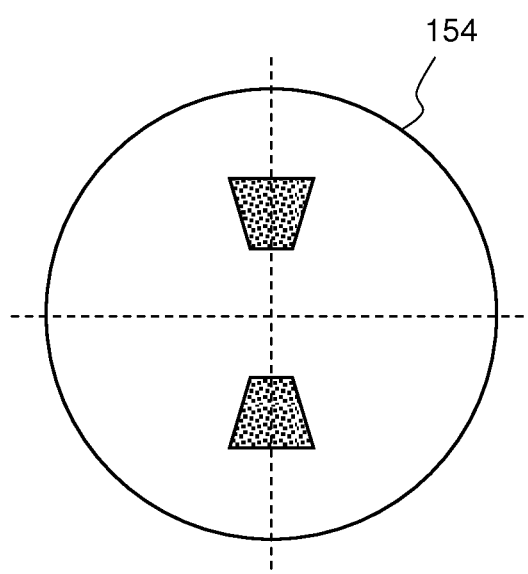
Figure 9:
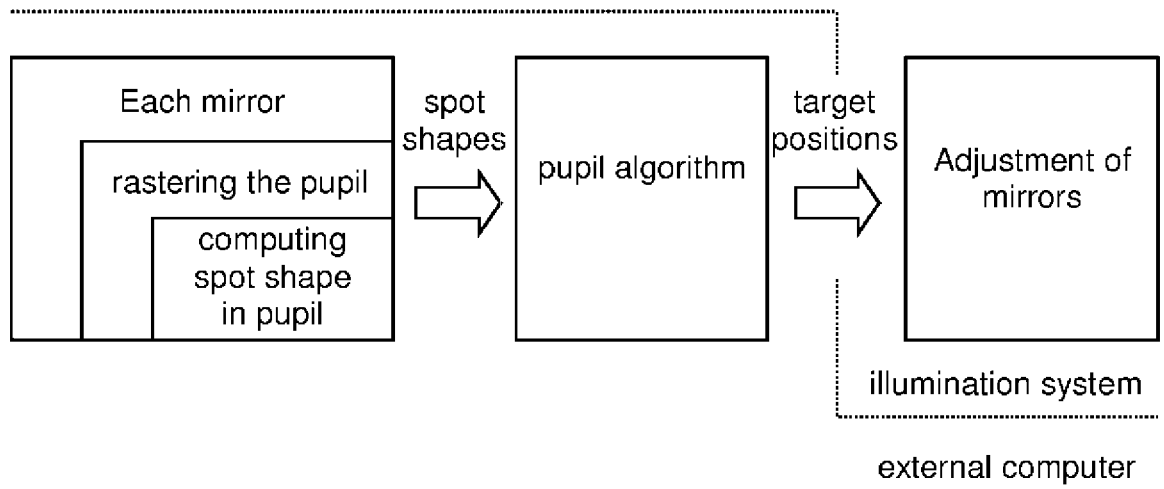
Figure 10:
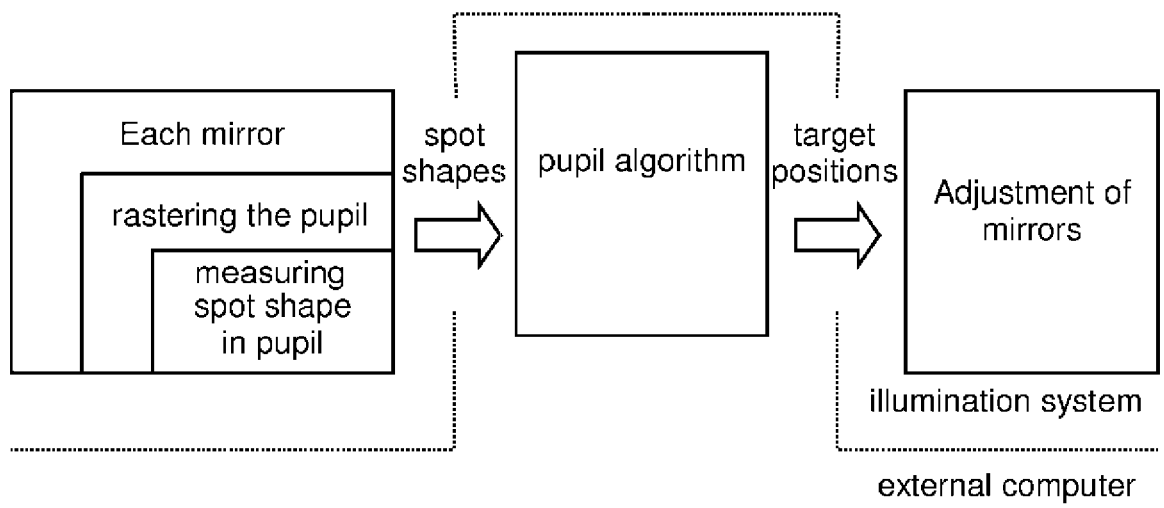

FIG. 21 shows another actual intensity distribution in the system pupil surface 154 as produced by the diffractive optical element 134, illuminator optics and a pupil shaping optical subsystem. The intensity distribution shown in FIG. 21 corresponds to a Y dipole illumination setting. In this setting the polar width is 35°, the inner σ is 0.3 and the outer σ is 0.5.

Both intensity distributions have been produced using a diffractive optical element 134 which is designed such that it produces an angular distribution having a Fourier transform that significantly differs from the intensity distributions shown in FIGS. 20 and 21. More particularly, this Fourier transform has values for the inner and/or the outer σ that differ by more than 0.01, and for certain illuminator optics and pupil shaping optical subsystems by more than 0.02, from the values indicated above for the intensity distributions actually obtained in the system pupil surface 154. Furthermore, this Fourier transform has a value for the polar width that differs by more than 1°, and for certain illuminator optics and pupil shaping optical subsystems by more than 2°, from the values indicated above for the intensity distributions actually obtained in the system pupil surface 154.

The same also applies to annular illumination settings that can be described by the same pupil quantities (inner and outer σ, polar width) as mentioned above.

III. Final Remarks

Figure 14:
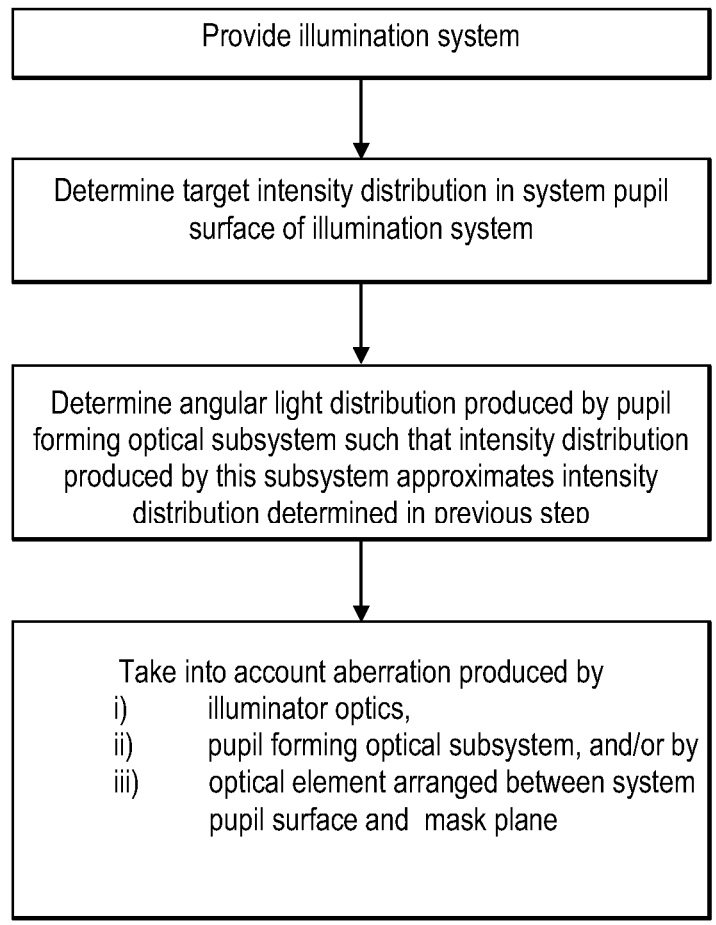
FIG. 14 is a flow diagram of a method of determining deflection angles to be produced by a beam deflecting component of a pupil shaping optical subsystem in accordance with another aspect of the present disclosure.

According to one aspect of the present disclosure, the determination of the angular light distribution, which is produced by the pupil shaping components, for example tiltable mirror elements $M_{ij}$ or a diffractive optical element, and which is involved to obtain a desired intensity distribution in the system pupil surface, may involve the consideration of aberrations. As is summarized in the flow diagram of FIG. 14, these aberrations may be produced by the optics illuminating the pupil shaping optical subsystem, the pupil shaping optical subsystem itself, and/or optical elements arranged between system pupil surface and mask plane.

The above description has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

What is claimed is:

1. A diffractive optical element configured to be inserted into a light beam path of an illumination system of a microlithographic projection exposure apparatus so that, during use of the illumination system, the diffractive optical element produces an intensity distribution in a pupil surface of the illumination system, wherein:
a Fourier transform of an angular distribution produced by the diffractive optical element differs from the intensity distribution;
the diffractive optical element comprises a plurality of gratings; and
the gratings are configured so that, during use of the diffractive optical element, each ray of light incident on the gratings is deflected so that rays of the light emerging from the gratings diverge from each other.

2. The diffractive optical element of claim 1, wherein the intensity distribution is defined by pupil quantities inner σ, outer σ and pole width, and wherein values of the pupil quantities for the intensity distribution differ from corresponding values for the Fourier transform of the angular distribution produced by the diffractive optical element by more than 0.1 for the inner σ, by more than 0.1 for the outer σ, and/or by at least 1° for the pole width.

3. The diffractive optical element of claim 1, wherein values of the pupil quantities for the desired intensity distribution differ from corresponding values for the Fourier transform of the angular distribution produced by the diffractive optical element by more than 0.2 for the inner σ, by more than 0.2 for the outer σ, and/or by at least 2° for the pole width.

4. An illumination system, comprising:
the diffractive optical element of claim 1,
wherein the illumination system is a microlithographic illumination system.

5. An apparatus, comprising:
an illumination system which comprises the diffractive optical element of claim 1,
wherein the apparatus is a microlithographic projection exposure apparatus.

6. A method, comprising:
determining an angular distribution to be produced by a diffractive optical element configured to be inserted in an illumination system of a microlithographic projection exposure apparatus so that, during use of the illumination system, the diffractive optical element produces together with a pupil shaping system, which is between the diffractive optical element and a pupil surface of the illumination system, an intensity distribution in the pupil surface of the illumination system that approximates a desired intensity distribution,
wherein:
the diffractive optical element comprises a plurality of gratings;
the gratings are configured so that, during use of the diffractive optical element, each ray of light incident on the gratings is deflected so that rays of the light emerging from the gratings diverge from each other;
a Fourier transform of an angular distribution produced by the diffractive optical element differs from the desired intensity distribution; and
the determination comprises taking into account at least one of the following:
an aberration produced by illuminator optics which are configured to illuminate the diffractive optical element; and
an aberration produced by the pupil shaping optical subsystem.

7. The method of claim 6, comprising:
determining a design intensity distribution which results in the desired intensity distribution when the one or more aberrations are taken into account; and
determining the angular distribution as an inverse Fourier transform of the design intensity distribution.

8. The method of claim 6, comprising:
determining diffractive structures that produce the determined angular distribution; and
forming the diffractive structures on a support.

9. The diffractive optical element of claim 1, wherein the gratings are configured so that, during use of the diffractive optical element, the light is diffracted with a range of angles at each location on the diffractive optical element on which the light impinges.

10. The diffractive optical element of claim 9, wherein the range of angles is from −3° to +3° relative to a normal of the diffractive optical element.

11. The illumination system of claim 4, further comprising a zoom lens group having a front focal plane, wherein the diffractive optical element is disposed in the front focal plane of the zoom lens group.

12. The illumination system of claim 11, further comprising an optical raster element between the zoom lens group and the pupil surface of the illumination system.

13. The diffractive optical element of claim 1, wherein values of the pupil quantities for the desired intensity distribution differ from corresponding values for the Fourier transform of the angular distribution produced by the diffractive optical element by more than 0.2 for the inner σ.

14. The diffractive optical element of claim 1, wherein values of the pupil quantities for the desired intensity distribution differ from corresponding values for the Fourier transform of the angular distribution produced by the diffractive optical element by more than 0.2 for the outer σ.

15. The diffractive optical element of claim 1, wherein values of the pupil quantities for the desired intensity distribution differ from corresponding values for the Fourier transform of the angular distribution produced by the diffractive optical element by at least 2° for the pole width.

16. The diffractive optical element of claim 1, wherein the Fourier transform of the angular distribution produced by the diffractive optical element has values for the inner and/or the outer σ that differ by more than 0.01 from values for the intensity distribution.

17. The diffractive optical element of claim 1, wherein the Fourier transform of the angular distribution produced by the diffractive optical element has values for the inner and/or the outer σ that differ by more than 0.02 from values for the intensity distribution.

18. The diffractive optical element of claim 1, wherein the Fourier transform of the angular distribution produced by the diffractive optical element has a value a polar width that differs by more than 1° from a value for the intensity distribution.

19. The diffractive optical element of claim 1, wherein the Fourier transform of the angular distribution produced by the diffractive optical element has a value a polar width that differs by more than 2° from a value for the intensity distribution.

20. An illumination system, comprising:
a diffractive optical element configured to be inserted into a light beam path of the illumination system so that, during use of the illumination system, the diffractive optical element produces an intensity distribution in a pupil surface of the illumination system;
a zoom lens group having a front focal plane; and
an optical raster element between the zoom lens group and the pupil surface of the illumination system,
wherein:
the diffractive optical element is disposed in the front focal plane of the zoom lens group;
a Fourier transform of an angular distribution produced by the diffractive optical element differs from the intensity distribution; and
the illumination system is a microlithographic illumination system.

21. The diffractive optical element of claim 20, wherein values of the pupil quantities for the desired intensity distribution differ from corresponding values for the Fourier transform of the angular distribution produced by the diffractive optical element by more than 0.2 for the inner $\sigma$.

22. The diffractive optical element of claim 20, wherein values of the pupil quantities for the desired intensity distribution differ from corresponding values for the Fourier transform of the angular distribution produced by the diffractive optical element by more than 0.2 for the outer $\sigma$.

23. The diffractive optical element of claim 20, wherein values of the pupil quantities for the desired intensity distribution differ from corresponding values for the Fourier transform of the angular distribution produced by the diffractive optical element by at least 2° for the pole width.

24. The diffractive optical element of claim 20, wherein the Fourier transform of the angular distribution produced by the diffractive optical element has values for the inner and/or the outer $\sigma$ that differ by more than 0.01 from values for the intensity distribution.

25. The diffractive optical element of claim 20, wherein the Fourier transform of the angular distribution produced by the diffractive optical element has values for the inner and/or the outer $\sigma$ that differ by more than 0.02 from values for the intensity distribution.

26. The diffractive optical element of claim 20, wherein the Fourier transform of the angular distribution produced by the diffractive optical element has a value a polar width that differs by more than 1° from a value for the intensity distribution.

27. The diffractive optical element of claim 20, wherein the Fourier transform of the angular distribution produced by the diffractive optical element has a value a polar width that differs by more than 2° from a value for the intensity distribution.

* * * * *

UNITED STATES PATENT AND TRADEMARK OFFICE
CERTIFICATE OF CORRECTION

| | | |
|---|---|---|
| PATENT NO. | : 9,310,694 B2 | Page 1 of 2 |
| APPLICATION NO. | : 13/901306 | |
| DATED | : April 12, 2016 | |
| INVENTOR(S) | : Erich Schubert et al. | |

It is certified that error appears in the above-identified patent and that said Letters Patent is hereby corrected as shown below:

Title page, Col. 2, line 4 under "OTHER PUBLICATIONS", delete "Fisher" and insert -- Fish --.

Drawings

Sheet 7, Figure 10, delete "measureing" and insert -- measuring --. (See attached sheet)

Specification

Col. 1, Lines 9-15, delete "This application is a continuation of, and claims benefit under 35 USC 120 to, international application PCT/EP2008/010622, filed December 13, 2008, which claims benefit of United States Provisional Application No. 61/016,019, filed December 21, 2007. International application PCT/EP2008/010622 is hereby incorporated by reference in its entirety." and insert -- This application is a continuation of, and claims benefit under 35 USC 120 to, U.S. Application No. 12/795,014, filed June 7, 2010, which is a continuation of, and claims priority under 35 USC 120 to, international application PCT/EP2008/010622, filed December 13, 2008, now U.S. Patent No. 8,467,031, which claims benefit of United States Provisional Application No. 61/016,019, filed December 21, 2007. U.S. Application No. 12/795,014 and international application PCT/EP2008/010622 are hereby incorporated by reference in their entirety. --.

Col. 3, line 64, delete "theses" and insert -- these --.

Signed and Sealed this
Ninth Day of August, 2016

Michelle K. Lee
*Director of the United States Patent and Trademark Office*